United States Patent
Yamazawa

(10) Patent No.: US 10,593,517 B2
(45) Date of Patent: *Mar. 17, 2020

(54) PLASMA PROCESSING APPARATUS

(71) Applicant: TOKYO ELECTRON LIMITED, Tokyo (JP)

(72) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 287 days.

This patent is subject to a terminal disclaimer.

(21) Appl. No.: 15/593,861

(22) Filed: May 12, 2017

(65) Prior Publication Data
US 2017/0338081 A1 Nov. 23, 2017

(30) Foreign Application Priority Data
May 18, 2016 (JP) ................................. 2016-099568

(51) Int. Cl.
*H01J 37/32* (2006.01)

(52) U.S. Cl.
CPC .. *H01J 37/32183* (2013.01); *H01J 37/32091* (2013.01)

(58) Field of Classification Search
CPC ..................................................... C23C 14/40
USPC ................... 118/723 E; 156/345.47
See application file for complete search history.

(56) References Cited

U.S. PATENT DOCUMENTS

| 2,087,636 | A | 7/1937 | Baumann |
| 4,255,682 | A | 3/1981 | Toida et al. |
| 4,612,527 | A | 9/1986 | Third et al. |
| 5,147,493 | A * | 9/1992 | Nishimura ........ H01J 37/32082 118/723 E |
| 5,519,275 | A | 5/1996 | Scott et al. |
| 5,783,984 | A | 7/1998 | Keuneke |
| 6,118,201 | A | 9/2000 | Dulin et al. |
| 2003/0037881 | A1* | 2/2003 | Barnes .............. H01J 37/32082 156/345.44 |
| 2009/0002111 | A1 | 1/2009 | Harrison et al. |
| 2010/0123451 | A1 | 5/2010 | Freer |

(Continued)

FOREIGN PATENT DOCUMENTS

| CN | 103256930 A | 8/2013 |
| CN | 104349567 A1 | 2/2015 |

(Continued)

*Primary Examiner* — Ram N Kackar

(74) *Attorney, Agent, or Firm* — Nath, Goldberg & Meyer; Jerald L. Meyer

(57) ABSTRACT

A capacitively coupled plasma processing apparatus includes: a chamber body configured to provide a chamber; first and second electrodes installed such that an internal space of the chamber is defined between the first and second electrodes; a high frequency power supply; a matcher for impedance matching connected to the high frequency power supply; a transformer including a primary coil coupled to the high frequency power supply via the matcher, first and second secondary coils; and at least one impedance adjusting circuit having a variable impedance, and installed in at least one of a first serial circuit between the first electrode and a ground connected to the other end of the first secondary coil, and a second serial circuit between the second electrode and a ground connected to the other end of the second secondary coil.

2 Claims, 18 Drawing Sheets

(56) References Cited

U.S. PATENT DOCUMENTS

2015/0115762 A1    4/2015  Rozman et al.
2015/0116065 A1    4/2015  Jeong et al.

FOREIGN PATENT DOCUMENTS

| | | | | |
|---|---|---|---|---|
| GB | 2206251 | * | 12/1988 | ............... H03H 7/38 |
| JP | 4-48727 A | | 2/1992 | |
| JP | 3016821 | | 12/1999 | |
| JP | 2002-343768 A | | 11/2002 | |
| KR | 10-2010-0131961 A | | 12/2010 | |

* cited by examiner

PLASMA PROCESSING APPARATUS

CROSS-REFERENCE TO RELATED APPLICATION

This application claims the benefit of Japanese Patent Application No. 2016-099568, filed on May 18, 2016, in the Japan Patent Office, the disclosure of which is incorporated herein in its entirety by reference.

TECHNICAL FIELD

The present disclosure relates to a plasma processing apparatus.

BACKGROUND

In manufacturing electronic devices such as semiconductor devices, a plasma processing apparatus is used for processes such as etching and film formation. A capacitively coupled plasma processing apparatus is known as one type of plasma processing apparatus. The capacitively coupled plasma processing apparatus generally includes a chamber body, an upper electrode, and a lower electrode. The upper electrode and the lower electrode are disposed such that an internal space of a chamber provided by the chamber body is defined between the upper electrode and the lower electrode. In this plasma processing apparatus, a gas is supplied to the chamber and a high frequency electric field is formed between the upper electrode and the lower electrode. The gas is excited by the high frequency electric field to generate plasma. A workpiece is processed by the ions and/or radicals produced from the plasma.

Further, a plasma processing apparatus configured to distribute a high frequency from a single high frequency power supply to an upper electrode and a lower electrode is known as one type of capacitively coupled plasma processing apparatus. This plasma processing apparatus includes a transformer. The transformer is provided with a primary coil and a secondary coil. The primary coil is connected to the high frequency power supply. One end of the secondary coil is connected to the upper electrode, and the other end thereof is connected to the lower electrode. The secondary coil has a plurality of taps selectively connected to a ground. In this plasma processing apparatus, a ratio of the electric power of the high frequency supplied to the upper electrode and the electric power of the high frequency supplied to the lower electrode, i.e., an electric power ratio, is adjusted by changing the respective tap to be connected to the ground. Such adjustment of the electric power ratio adjusts the energy of the ions incident to a workpiece disposed on the lower electrode.

In addition, a plasma processing apparatus including a filter having variable impedance installed between a lower electrode and a ground is known as another type of capacitively coupled plasma processing apparatus. In this plasma processing apparatus, a current flowing into the lower electrode is adjusted by adjusting the impedance of the filter. Such adjustment of the current adjusts the energy of the ions incident to a workpiece disposed on the lower electrode.

In the plasma processing apparatus, it is required to process a workpiece by the ions of various kinds of energies. Thus, in the capacitively coupled plasma processing apparatus, the adjustable range of the energy of the ions incident to a workpiece disposed on an electrode is required to be enlarged.

SUMMARY

Some embodiments of the present disclosure provide a plasma processing apparatus in which an adjustable range of the energy of the ions incident to a workpiece disposed on an electrode is enlarged.

According to an embodiment of the present disclosure, a capacitively coupled plasma processing apparatus, including: a chamber body configured to provide a chamber; a first electrode and a second electrode installed such that an internal space of the chamber is defined between the first electrode and the second electrode; a high frequency power supply; a matcher for impedance matching connected to the high frequency power supply; a transformer including a primary coil coupled to the high frequency power supply via the matcher, a first secondary coil and a second secondary coil, wherein one end of the first secondary coil is connected to the first electrode and one end of the second secondary coil is connected to the second electrode; and at least one impedance adjusting circuit having a variable impedance, and installed in at least one of a first serial circuit between the first electrode and a ground connected to the other end of the first secondary coil, and a second serial circuit between the second electrode and a ground connected to the other end of the second secondary coil.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
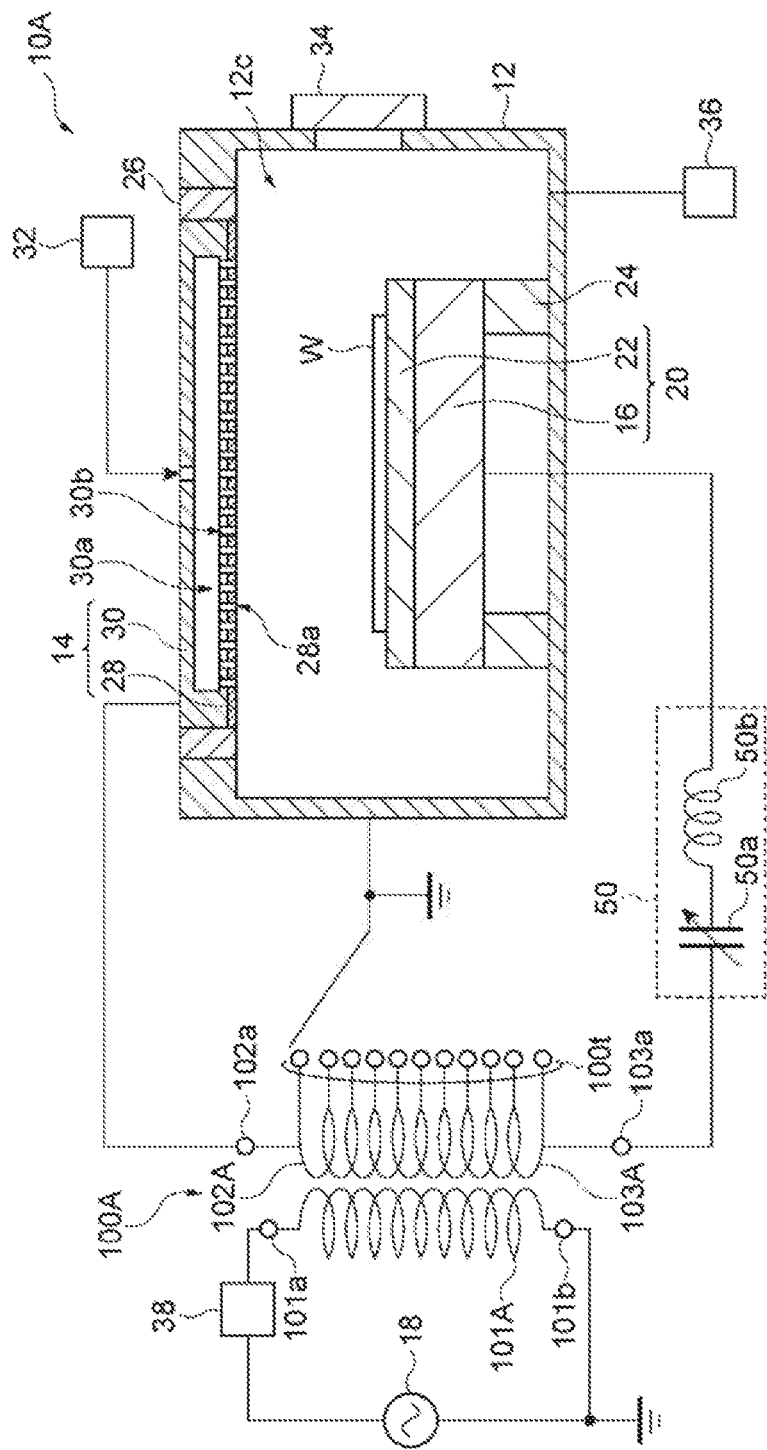
FIG. 1 is a diagram illustrating a plasma processing apparatus according to an embodiment of the present disclosure.

Reference will now be made in detail to various embodiments, examples of which are illustrated in the accompanying drawings. Further, the same or equivalent parts in the drawings will be denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a diagram illustrating a plasma processing apparatus according to an embodiment of the present disclosure. A plasma processing apparatus 10A illustrated in FIG. 1 is a capacitively coupled plasma processing apparatus. The plasma processing apparatus 10A includes a chamber body 12, an upper electrode 14 as a first electrode, a lower electrode 16 as a second electrode, a high frequency power supply 18, a matcher 38, an impedance adjusting circuit 50, and a transformer 100A.

An internal space of the chamber body 12 is provided as a chamber 12c. The chamber body 12 is formed of metal such as aluminum. A plasma-resistant coating is formed on an inner wall surface of the chamber body 12. The plasma-resistant coating may be a ceramic film such as an alumite film or an yttrium oxide film. The chamber body 12 has a substantially cylindrical sidewall portion, a bottom portion continuously extending from a lower end of the sidewall portion, and an upper end portion continuously extending from an upper end of the sidewall portion. The chamber body 12 is grounded.

A stage 20 is installed inside the chamber body 12. The stage 20 includes the lower electrode 16. Further, in one embodiment, the stage 20 further includes an electrostatic chuck 22. The stage 20 is supported by an insulating support 24 extending from the bottom portion of the chamber body 12. The lower electrode 16 has a substantially disc shape and is formed of a conductor such as aluminum. The electrostatic chuck 22 is installed on the lower electrode 16. The electrostatic chuck 22 includes a dielectric film and an electrode embedded in the dielectric film. A power supply is coupled to the electrode of the electrostatic chuck 22 via a switch. As a voltage is applied to the electrode of the electrostatic chuck 22 from the power supply, the electrostatic chuck 22 generates an electrostatic force. The electrostatic chuck 22 adsorbs a workpiece W loaded thereon and supports the workpiece W by virtue of the electrostatic force.

The upper electrode 14 and the lower electrode 16 are installed such that the internal space of the chamber 12c is interposed therebetween. In one embodiment, the upper end portion of the chamber body 12 is opened. The upper electrode 14 is supported by the upper end portion of the chamber body 12 with an insulating member 26 interposed therebetween. The upper electrode 14 closes the opening of the upper end portion of the chamber body 12 together with the member 26. The upper electrode 14 includes a ceiling plate 28 and a support 30. The ceiling plate 28 is positioned to face the chamber 12c. The ceiling plate 28 may be formed of a material such as silicon, aluminum, or quartz. Further, when the ceiling plate 28 is formed of aluminum, a plasma-resistant coating is formed on a surface of the ceiling plate 28. A plurality of gas discharge holes 28a is formed in the ceiling plate 28.

The support 30 detachably supports the ceiling plate 28. The support 30 is formed of, for example, a conductor such as aluminum. A gas diffusion chamber 30a is formed within the support 30. A plurality of holes 30b through which the gas diffusion chamber 30a and the gas discharge holes 28a are connected to each other, is formed in the support 30. Further, a gas supply part 32 for supplying a gas for plasma process is connected to the gas diffusion chamber 30a. The gas supply part 32 includes a plurality of gas sources, a plurality of flow rate controllers such as mass flow controllers, and a plurality of valves. Each of the plurality of gas sources is coupled to the gas diffusion chamber 30a via a respective one among the plurality of flow rate controls and a respective one among the plurality of valves. This gas supply part 32 adjusts a flow rate of a gas supplied from one selected from among the plurality of gas sources, and supplies the gas to the gas diffusion chamber 30a. The gas supplied to the gas diffusion chamber 30a is supplied to the chamber 12c through the gas discharge holes 28a.

An opening, through which the workpiece is transferred, is formed in a sidewall portion of the chamber body 12. This opening is configured to be opened and closed by a gate valve 34. In addition, an exhaust device 36 is connected to the chamber 12c. An internal pressure of the chamber 12c is reduced by the exhaust device 36.

The high frequency power supply 18 generates high frequency to be supplied to the primary coil 101A of the transformer 100A. The high frequency power supply 18 is coupled to the primary coil 101A of the transformer 100A via the matcher 38. The matcher 38 is equipped with a matching circuit for matching the output impedance of the high frequency power supply 18 with the load-side impedance.

The transformer 100A includes the primary coil 101A, a first secondary coil 102A and a second secondary coil 103A. One end of the primary coil 101A is a terminal 101a, and the other end thereof is a terminal 101b. The terminal 101a is coupled to the high frequency power supply 18 via the matcher 38. The terminal 101b is coupled to the high frequency power supply 18 via a ground.

The first secondary coil 102A and the second secondary coil 103A are electronically coupled with the primary coil 101A. One end of the first secondary coil 102A is a terminal 102a. The terminal 102a is electrically connected to the upper electrode 14. Further, one end of the second secondary coil 103A is a terminal 103a. The terminal 10a is electrically connected to the lower electrode 16.

In the transformer 100A, the first secondary coil 102A and the second secondary coil 103A are formed as a single coil. Specifically, a secondary side of the transformer 100A is configured as a single coil, which includes a plurality of taps 100t. The plurality of taps 100t is configured to be selectively connected to the ground. In the transformer 100A, with respect to a tap selected to be connected to the ground, one side of the single coil corresponds to the first secondary coil 102A and the other side thereof corresponds to the second secondary coil 103A.

In the plasma processing apparatus 10A, the impedance adjusting circuit 50 is installed in a serial circuit between the terminal 103a and the lower electrode 16. The impedance adjusting circuit 50 may include a variable condenser and/or an inductor. In the plasma processing apparatus 10A, the impedance adjusting circuit 50 includes a variable condenser 50a and an inductor 50b. The variable condenser 50a and the inductor 50b are connected in series between the lower electrode 16 and the terminal 103a. Further, the impedance adjusting circuit 50 includes no element connected to the ground.

Figure 2:
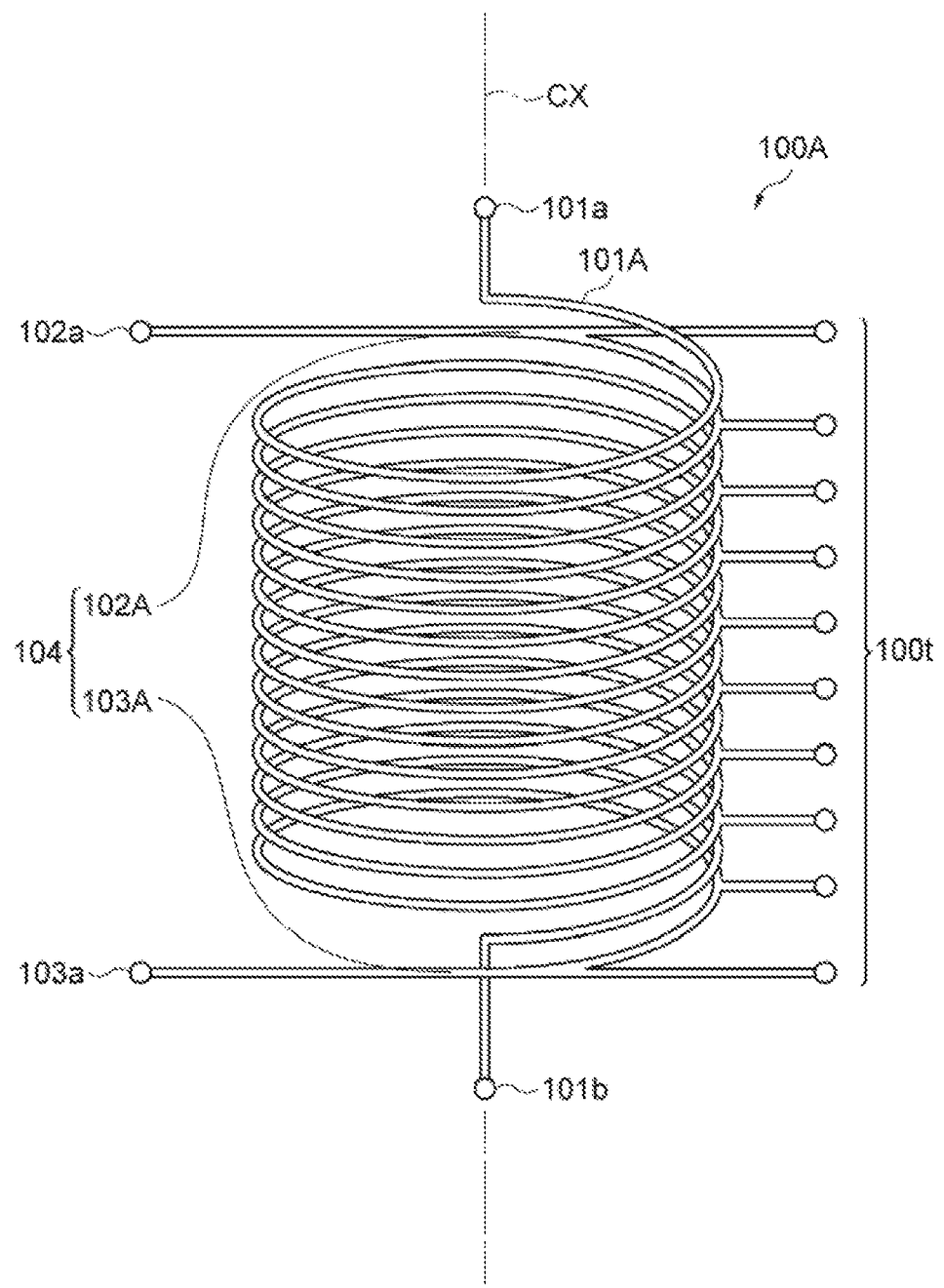
FIG. 2 is a diagram illustrating a transformer according to an embodiment of the present disclosure.

In one embodiment, the transformer 100A may be configured as illustrated in FIG. 2. FIG. 2 is a diagram illustrating a transformer according to an embodiment of the present disclosure. In the embodiment illustrated in FIG. 2, a winding of the primary coil 101A is spirally wound around a central axis CX. Further, the transformer 100A includes a single coil 104 as a secondary coil. The single coil 104 includes the plurality of taps 100t. The primary coil 101A and the single coil 104 are configured to share a cross section. For example, a winding of the single coil 104 is also spirally wound around the central axis CX in an alternate relationship with the winding of the primary coil 101A. As described above, the tap selected from among the plurality of taps 100t is connected to the ground. With respect to the selected tap, one side portion of the single coil 104 is the first secondary coil 102A and the other side portion thereof is the second secondary coil 103A.

Here, reactance ($X_2$) of the circuit defined when viewed the ground side from an output terminal of the secondary side of the transformer may be expressed by Eq. (1) below. In Eq. (1), $L_1$ denotes inductance of the primary coil, $L_2$ denotes inductance of the secondary coil, $R_m$ denotes resistance of the matcher, $X_m$ denotes reactance of the matcher, w denotes an angular frequency of the high frequency, and k is a coupling factor between the primary coil and the secondary coil.

$$X_2 = \frac{L_1\omega\{(R_m)^2 - k^2 L_2 \omega(X_m + L_2\omega) + (X_m + L_2\omega)^2\}}{(R_m)^2 + (X_m + L_2\omega)^2} \quad (1)$$

Where $R_m$ and $X_m$ are values respectively equivalent to reactance and resistance of a plasma load, and are sufficiently small, relative to reactance $L_{1\omega}$. Thus, Eq. (1) is modified as expressed by Eq. (2) below.

$$X_2 \approx L_1\omega(1-k^2) \quad (2)$$

Since k is a value close to 1, as can be understood from Eq. (2), the reactance $X_2$ is very small. Further, in the transformer 100A of the embodiment illustrated in FIG. 2, since k is approximately 1, the reactance $X_2$ is approximately 0. Thus, although the transformer 100A and the impedance adjusting circuit 50 are used together, the function of the impedance adjusting circuit 50 is utilized. Accordingly, according to the plasma processing apparatus 10A, it is possible to significantly change an electric potential of the lower electrode 16 between a positive electric potential and a negative electric potential by the transformer 100A and the impedance adjusting circuit 50. As a result, in the plasma processing apparatus 10A, the range of the energy of the ions incident to the workpiece W disposed on the lower electrode 16 can be adjusted in a wide range.

Figure 3:
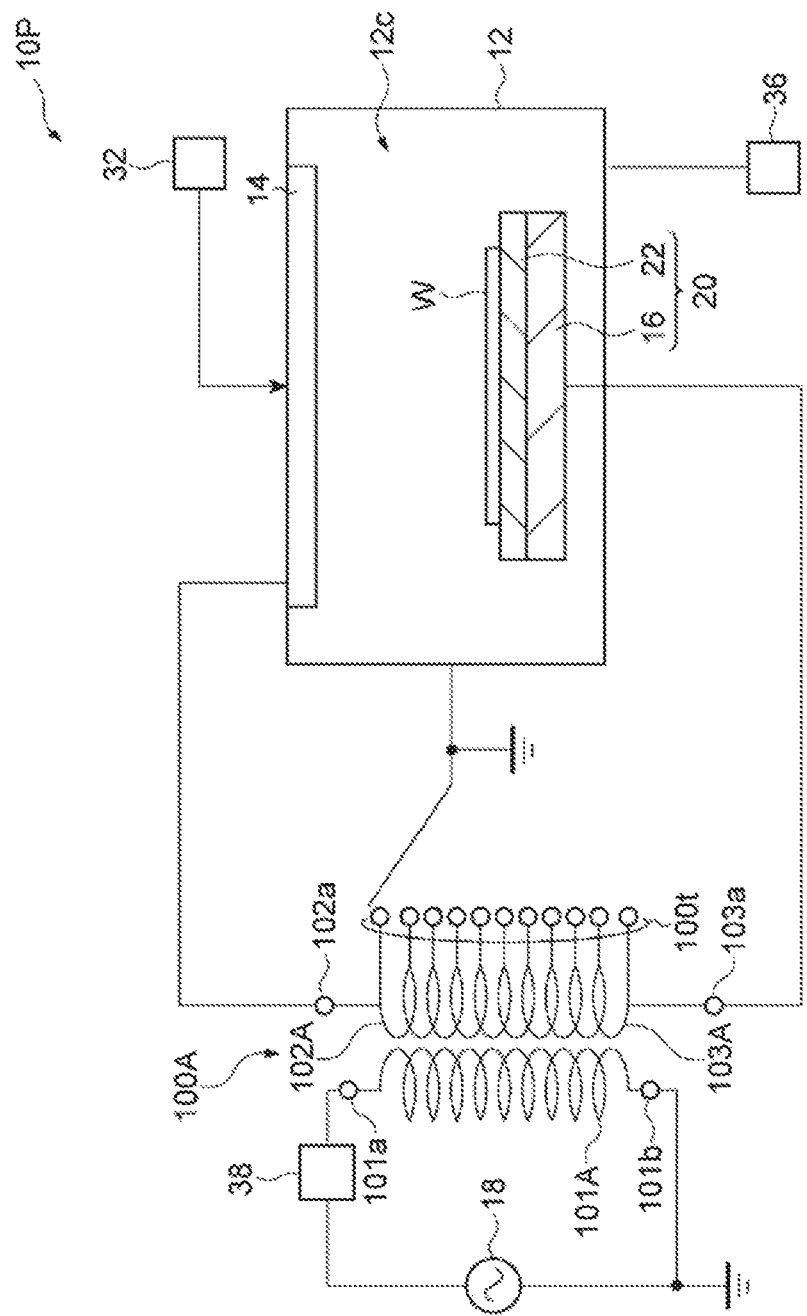
FIG. 3 is a diagram illustrating a plasma processing apparatus used in experiments.
Figure 4:
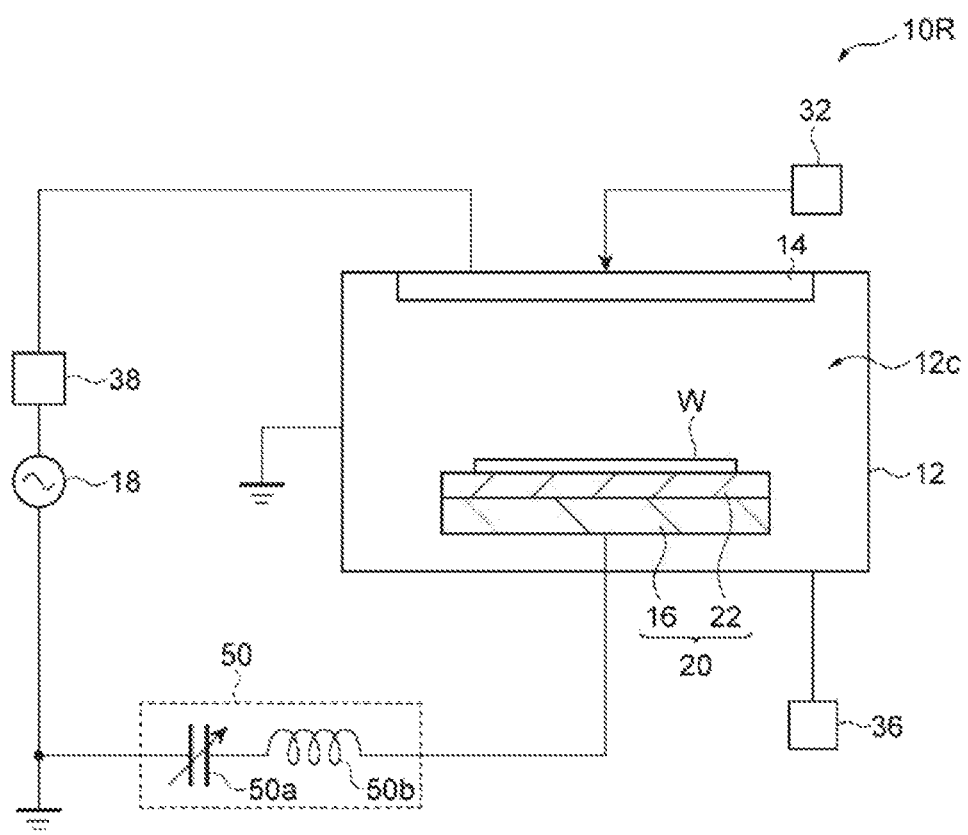
FIG. 4 is a diagram illustrating another plasma processing apparatus used in experiments.

Here, some experimental results will be described. First, as illustrated in FIG. 3, a plasma processing apparatus 10P was prepared without the impedance adjusting circuit 50 installed in the plasma processing apparatus 10A. Further, as illustrated in FIG. 4, a plasma processing apparatus 10R was prepared without the transformer 100A installed in the plasma processing apparatus 10A. In both the plasma processing apparatus 10P and the plasma processing apparatus 10R, an argon (Ar) gas of 900 sccm was supplied to the chamber 12c, the internal pressure of the chamber 12c was set at 800 mTorr (106.7 Pa), and the high frequency and the electric power of the high frequency power supply 18 were respectively set at 450 kHz and 500 W. In the plasma processing apparatus 10P, with respect to various set distribution ratios, a relationship between a distribution ratio and a current value of each of the upper electrode 14, the lower electrode 16 and the chamber body 12, and a relationship between a distribution ratio and an electric potential of each of the upper electrode 14 and the lower electrode 16 were obtained. Further, the distribution ratio is a ratio (set value) of the electric power distributed to the second secondary coil 103A to the total electric power of the secondary side of the transformer 100A. In this experiment, a distribution ratio was set by changing a tap to be connected to the ground, among the plurality of taps 100t. In addition, in the plasma processing apparatus 10R, with respect to various set reactances of the lower electrode 16, a relationship between reactance of the lower electrode 16 and a current value of each of the upper electrode 14, the lower electrode 16 and the chamber body 12, and a relationship between reactance of the lower electrode 16 and an electric potential of each of the upper electrode 14 and the lower electrode 16 were obtained. Further, the reactance of the lower electrode 16 was set by changing the impedance of the impedance adjusting circuit 50.

Figure 5A:
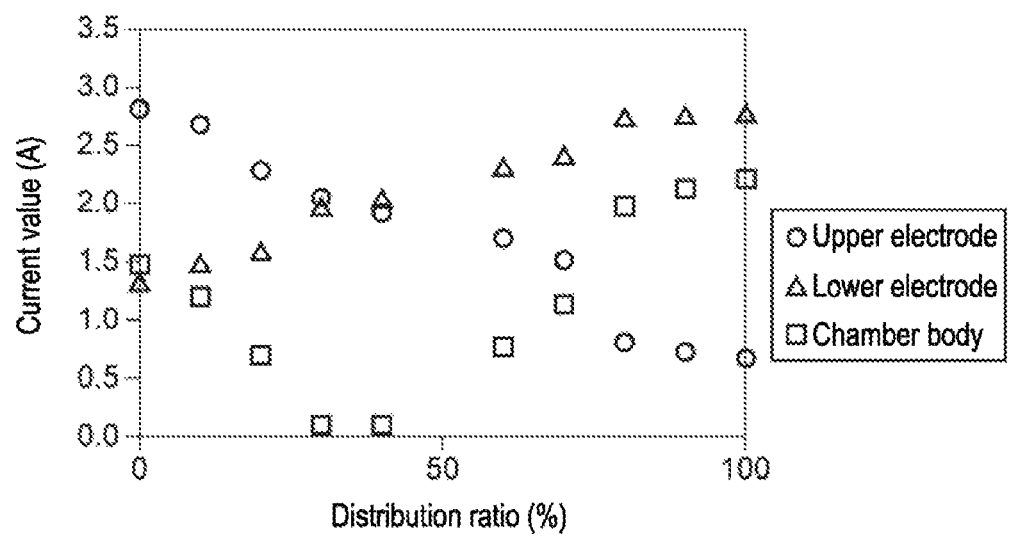
FIG. 5A is a graph illustrating a relationship between a distribution ratio and a current value of each of an upper electrode, a lower electrode and a chamber body, obtained by using the plasma processing apparatus.
Figure 5B:
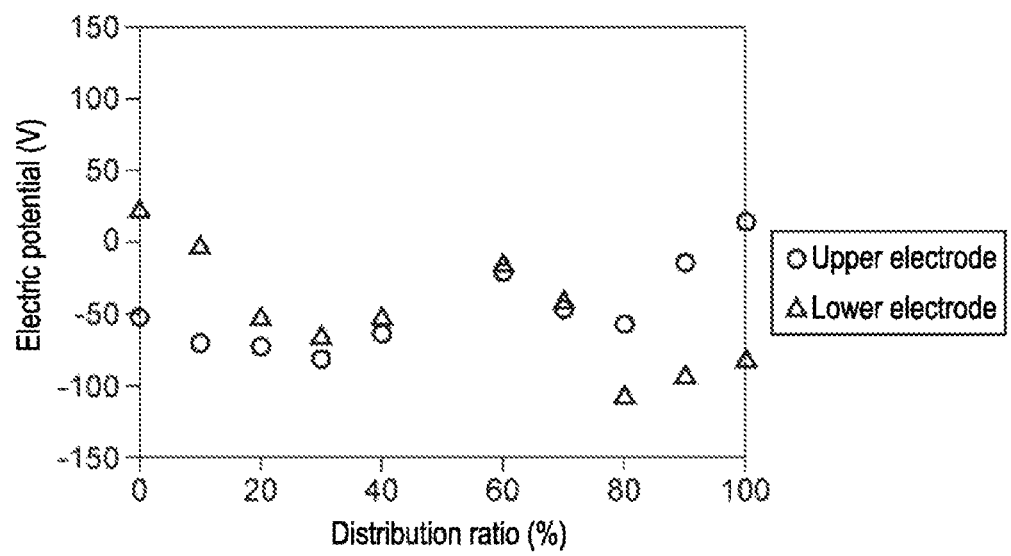
FIG. 5B is a graph illustrating a relationship between a distribution ratio and an electric potential of each of an upper electrode and a lower electrode, obtained by using the another plasma processing apparatus.

FIG. 5A illustrates a relationship between a distribution ratio and a current value of each of the upper electrode 14, the lower electrode 16 and the chamber body 12, which is obtained using the plasma processing apparatus 10P and FIG. 5B illustrates a relationship between a distribution ratio and an electric potential of each of the upper electrode 14 and the lower electrode 16, which is obtained using the plasma processing apparatus 10P. Further, FIG. 6A illustrates a relationship between reactance of the lower electrode 16 and a current value of each of the upper electrode 14, the lower electrode 16 and the chamber body 12, which is obtained using the plasma processing apparatus 10R, and FIG. 6B illustrates a relationship between reactance of the lower electrode 16 and an electric potential of each of the upper electrode 14 and the lower electrode 16, which is obtained using the plasma processing apparatus 10R.

As illustrated in FIG. 5A, in the plasma processing apparatus 10P, when the distribution ratio of e the electric power to the lower electrode 16 increases, a current flowing into the lower electrode 16 increased. When the current flowing into the lower electrode 16 increases, an electric potential of the lower electrode 16 turned to a negative potential as illustrated in FIG. 5B. Further, when the electric potential of the lower electrode 16 turns to the negative electric potential and becomes lower than that of the upper electrode 14, the ions are accelerated toward the lower electrode 16 so that the energy of the ions incident to the workpiece W increases.

Figure 6A:
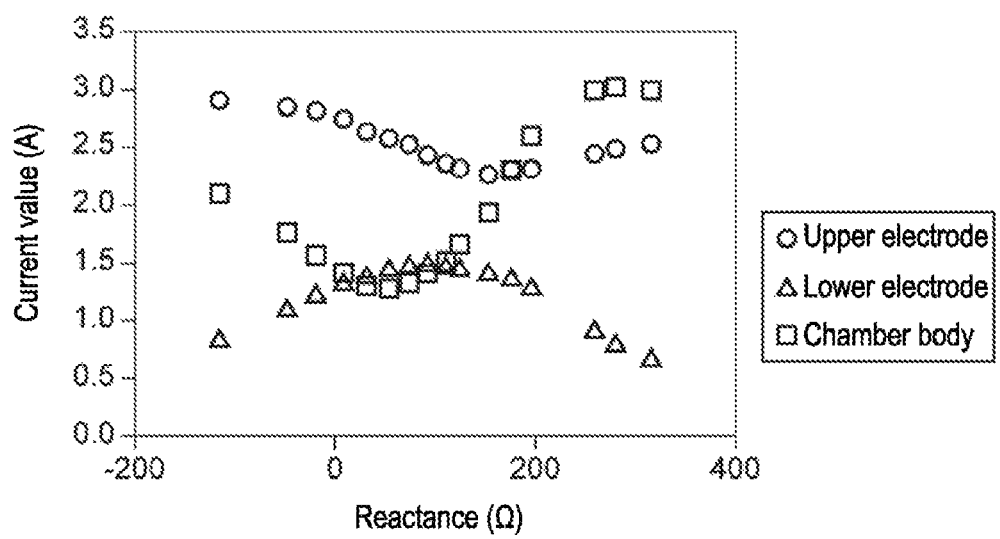
FIG. 6A is a graph illustrating a relationship between reactance of the lower electrode and a current value of each of the upper electrode, the lower electrode and the chamber body, obtained by using the another plasma processing apparatus.

Further, as illustrated in FIG. 6A, in the plasma processing apparatus 10R, when the impedance of the lower electrode 16 is high, most of current flowing into the plasma from the upper electrode 14 flown to the chamber body 12. When the impedance of the lower electrode 16 is about 100Ω, the impedance of the plasma sheath is canceled out to maximize a current flowing through the lower electrode 16. Referring to both FIG. 6A and FIG. 6B, when the current flowing through the lower electrode 16 increases, an electric potential of the lower electrode 16 was lowered. Further, when the electric potential of the lower electrode 16 is lowered, the ions are accelerated toward the lower electrode 16 so that the energy of the ions incident to the workpiece W increases.

Figure 6B:
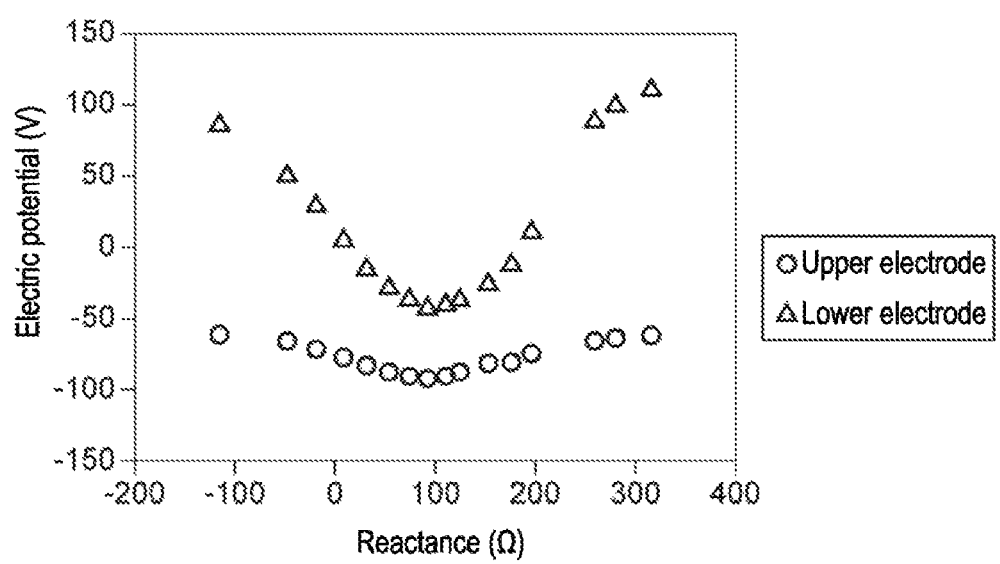
FIG. 6B is a graph illustrating a relationship between reactance of the lower electrode and an electric potential of each of the upper electrode and the lower electrode, obtained by using the another plasma processing apparatus.

When FIG. 5B and FIG. 6B are compared, in the plasma processing apparatus 10P, it was possible to adjust an electric potential of the lower electrode 16 within a range of a relatively low electric potential. Meanwhile, in the plasma processing apparatus 10R, it was possible to adjust an electric of the lower electrode 16 within a range of a relatively high electric potential. That is to say, according to the transformer 100A, it was conformed that it is possible to adjust the energy of the ions incident to the workpiece W within a range of relatively high energy. Meanwhile, according to the impedance adjusting circuit 50, it was confirmed that it is possible to adjust the energy of the ions incident to the workpiece W within a range of relatively low energy.

Further, in the plasma processing apparatus 10A, an argon (Ar) gas of 900 sccm was supplied to the chamber 12c, an internal pressure of the chamber 12c was set at 800 m Torr (106.7 Pa), and the high frequency and the electric power of the high frequency power supply 18 were respectively set at 450 kHz and 500 W. In addition, in the setting of various distribution ratios and various reactances of the lower electrode 16, a relationship between a current value of each of the upper electrode 14, the lower electrode 16 and the chamber body 12, and an electric potential of each of the upper electrode 14 and the lower electrode 16 were obtained.

Figure 7A:
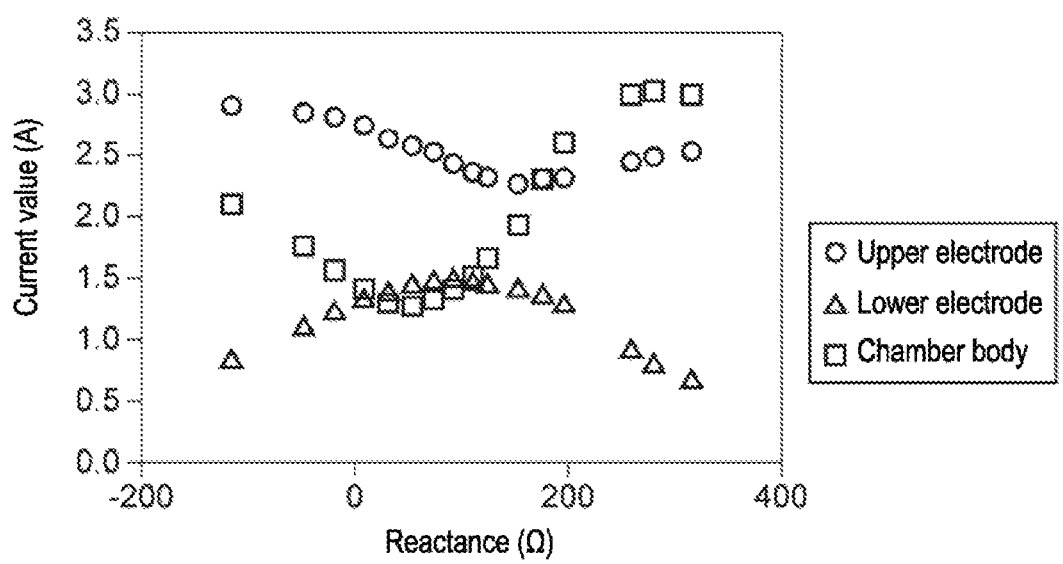
FIG. 7A is a graph illustrating a relationship between reactance of the lower electrode and a current value of each of the upper electrode, the lower electrode and the chamber body when a distribution ratio is 0%, obtained by using the plasma processing apparatus.
Figure 7B:
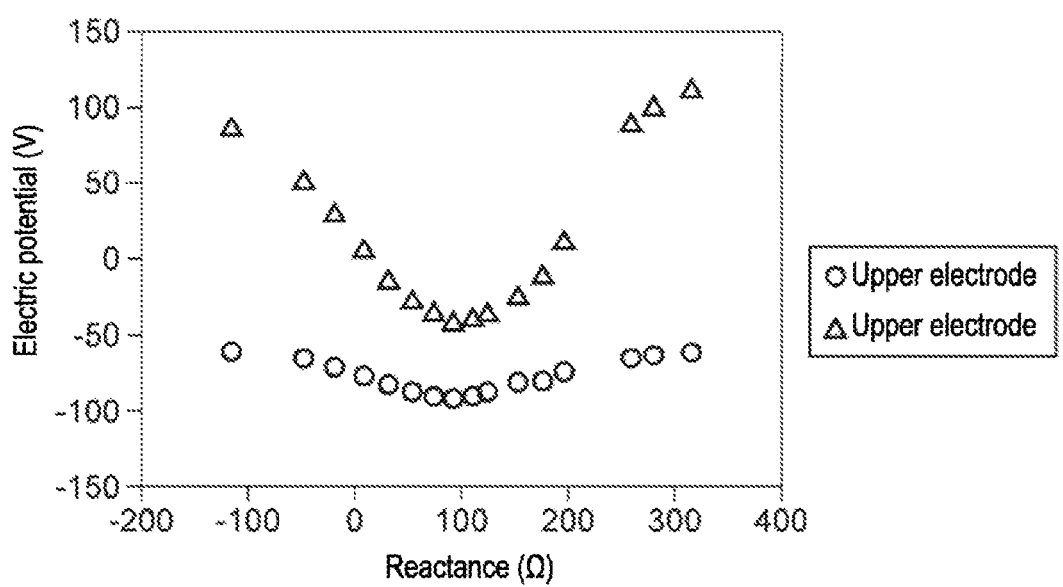
FIG. 7B is a graph illustrating a relationship between reactance of the lower electrode and an electric potential of each of the upper electrode and the lower electrode when the distribution ratio is 0%, obtained by using the plasma processing apparatus.
Figure 8A:
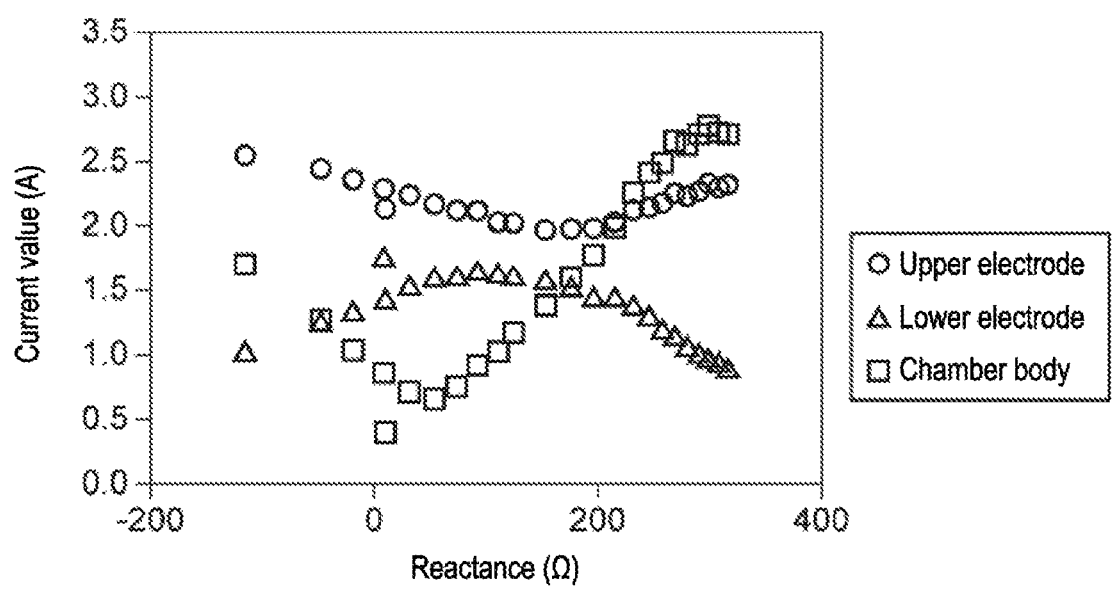
FIG. 8A is a graph illustrating a relationship between reactance of the lower electrode and a current value of each of the upper electrode, the lower electrode and the chamber body when the distribution ratio is 20%, obtained by using the plasma processing apparatus.
Figure 8B:
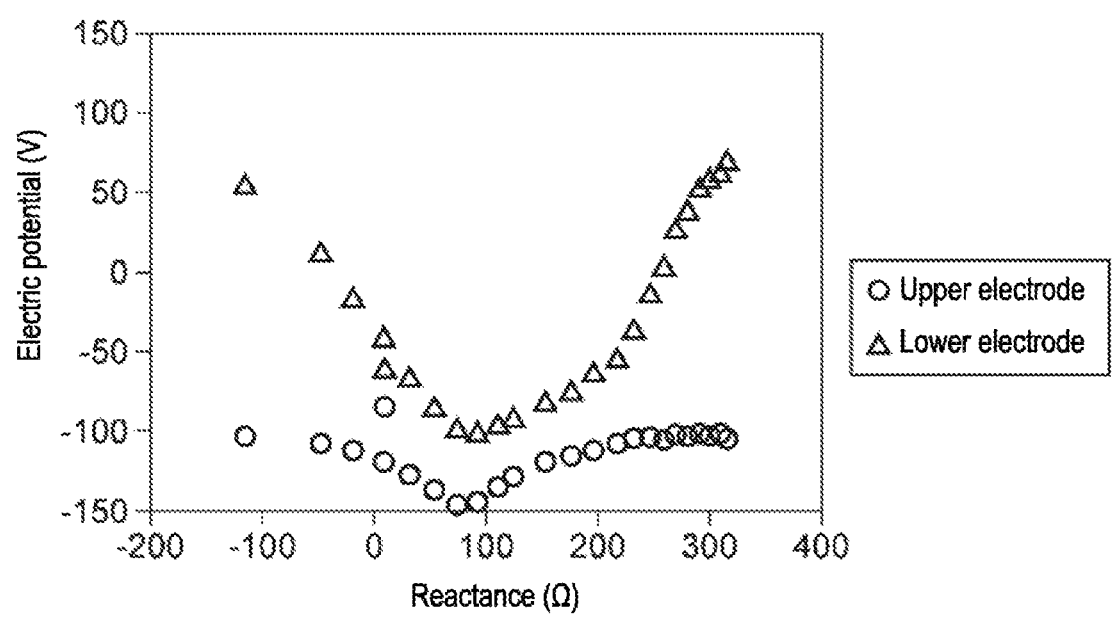
FIG. 8B is a graph illustrating a relationship between reactance of the lower electrode and an electric potential of each of the upper electrode and the lower electrode when the distribution ratio is 20%, obtained by using the plasma processing apparatus.
Figure 9A:
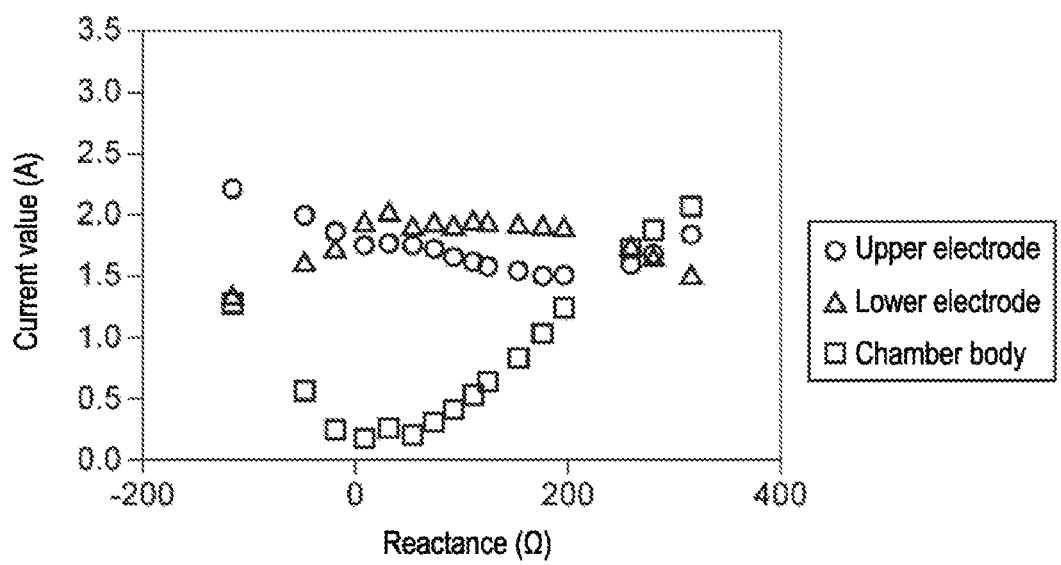
FIG. 9A is a graph illustrating a relationship between reactance of the lower electrode and a current value of each of the upper electrode, the lower electrode and the chamber body when the distribution ratio is 40%, obtained by using the plasma processing apparatus.
Figure 9B:
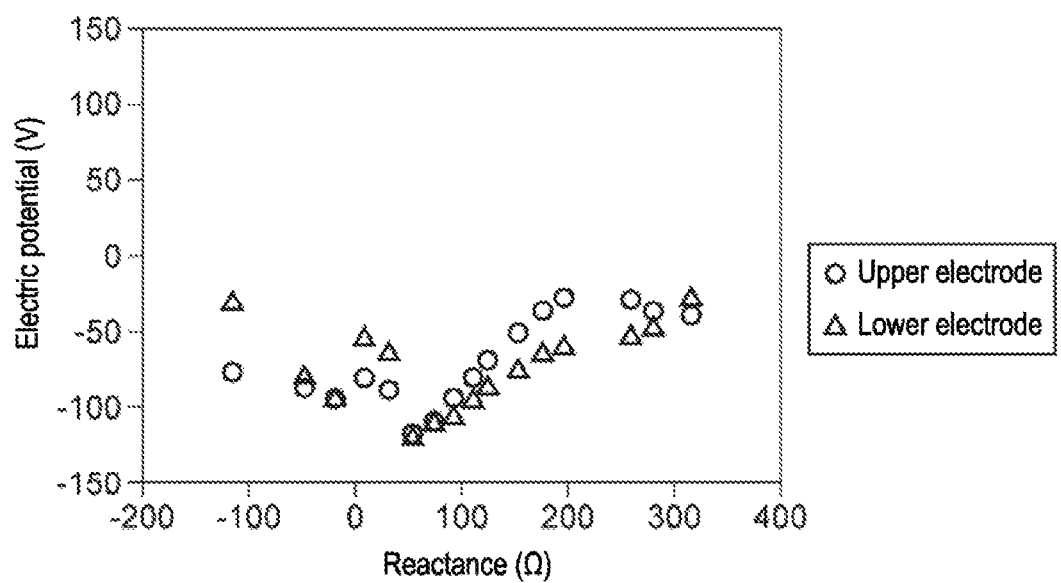
FIG. 9B is a graph illustrating a relationship between reactance of the lower electrode and an electric potential of each of the upper electrode and the lower electrode when the distribution ratio is 40%, obtained by using the plasma processing apparatus.
Figure 10A:
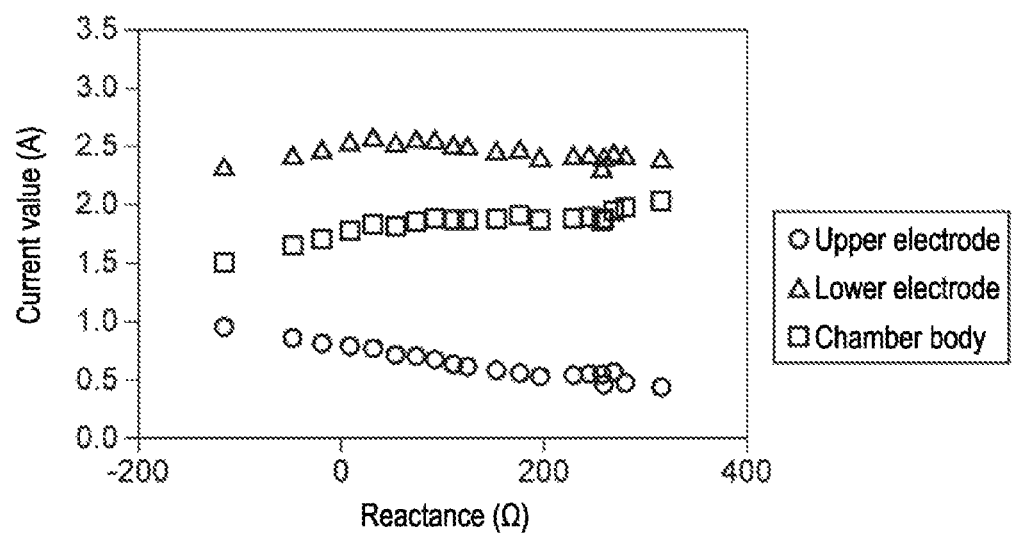
FIG. 10A is a graph illustrating a relationship between reactance of the lower electrode and a current value of each of the upper electrode, the lower electrode and the chamber body when the distribution ratio is 80%, obtained by using the plasma processing apparatus.
Figure 10B:
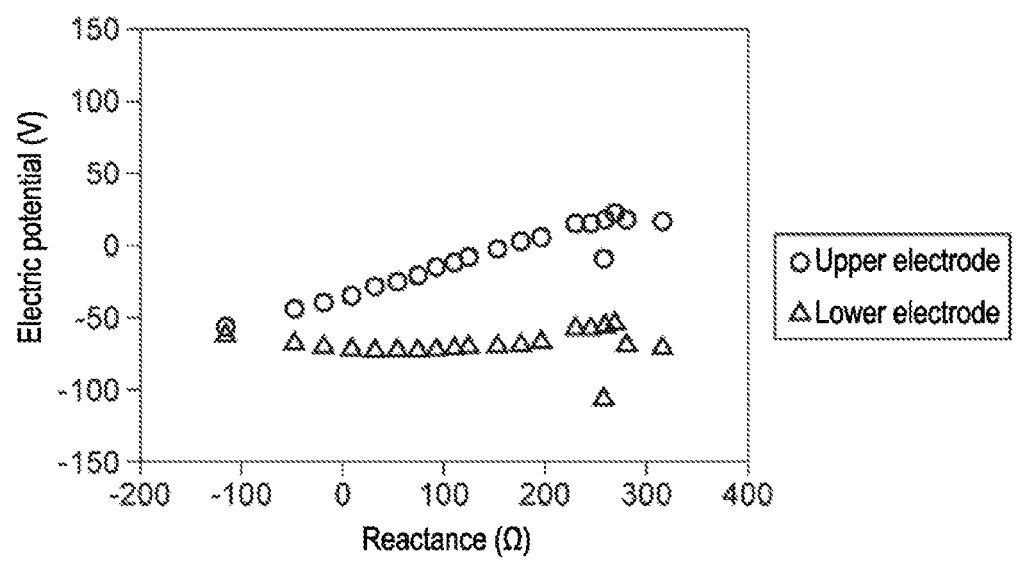
FIG. 10B is a graph illustrating a relationship between reactance of the lower electrode and an electric potential of each of the upper electrode and the lower electrode when the distribution ratio is 80%, obtained by using the plasma processing apparatus.

FIG. 7A illustrates a relationship between reactance of the lower electrode 16 and a current value of each of the upper electrode 14, the lower electrode 16 and the chamber body 12 when a distribution ratio is 0%, which is obtained using the plasma processing apparatus 10A, and FIG. 7B illustrates a relationship between reactance of the lower electrode 16 and an electric potential of each of the upper electrode 14 and the lower electrode 16 when a distribution ratio is 0%, which is obtained using the plasma processing apparatus 10A. FIG. 8A illustrates a relationship between reactance of the lower electrode 16 and a current value of each of the upper electrode 14, the lower electrode 16 and the chamber body 12 when a distribution ratio is 20%, which is obtained using the plasma processing apparatus 10A, and FIG. 8B illustrates a relationship between reactance of the lower electrode 16 and an electric potential of each of the upper electrode 14 and the lower electrode 16 when a distribution ratio is 20%, which is obtained using the plasma processing apparatus 10A. FIG. 9A illustrates a relationship between reactance of the lower electrode 16 and a current value of each of the upper electrode 14, the lower electrode 16 and the chamber body 12 when a distribution ratio is 40%, which is obtained using the plasma processing apparatus 10A, and FIG. 9B illustrates a relationship between reactance of the lower electrode 16 and an electric potential of each of the upper electrode 14 and the lower electrode 16 when a distribution ratio is 40%, which is obtained using the plasma processing apparatus 10A. FIG. 10A illustrates a relationship between reactance of the lower electrode 16 and a current value of each of the upper electrode 14, the lower electrode 16 and the chamber body 12 when a distribution ratio is 80%, which is obtained using the plasma processing apparatus 10A, and FIG. 10B illustrates a relationship between reactance of the lower electrode 16 and an electric potential of each of the upper electrode 14 and the lower electrode 16 when a distribution ratio is 80%, which is obtained using the plasma processing apparatus 10A. Further, when the distribution ratio is 0%, since the environment of the plasma processing apparatus 10A is equal to that of the plasma processing apparatus 10R, FIG. 6A and FIG. 7A are the same and FIG. 6B and FIG. 7B are the same.

As illustrated in FIG. 7A, FIG. 8A, FIG. 9A, and FIG. 10A, even in the plasma processing apparatus 10A, as the distribution ratio increases, the current flowing through the lower electrode 16 was increased. Further, as illustrated in FIG. 7B, FIG. 8B, FIG. 9B, and FIG. 10B, as the distribution ratio increases, the electric potential of the lower electrode 16 was lowered. In addition, as the distribution ratio increases, the electric potential of the lower electrode 16 was lower than that of the upper electrode 14. Thus, according to the plasma processing apparatus 10A, it was confirmed that it is possible to adjust the energy of the ions incident to the workpiece W within a range of relatively high energy by distributing the electric power by the transformer 100A. Further, as illustrated in FIG. 7B and FIG. 8B, it was confirmed that it is possible to adjust the electric potential of the lower electrode 16 within a range of a relatively high electric potential by adjusting the impedance of the lower electrode 16. Thus, according to the plasma processing apparatus 10A, it was confirmed that it is possible to adjust the energy of the ions incident to the workpiece W within a range of relatively low energy by adjusting the impedance of the impedance adjusting circuit 50. Accordingly, according to the plasma processing apparatus 10A, the adjustable range of energy of the ions incident to the workpiece W disposed on the lower electrode 16 is enlarged.

Figure 11:
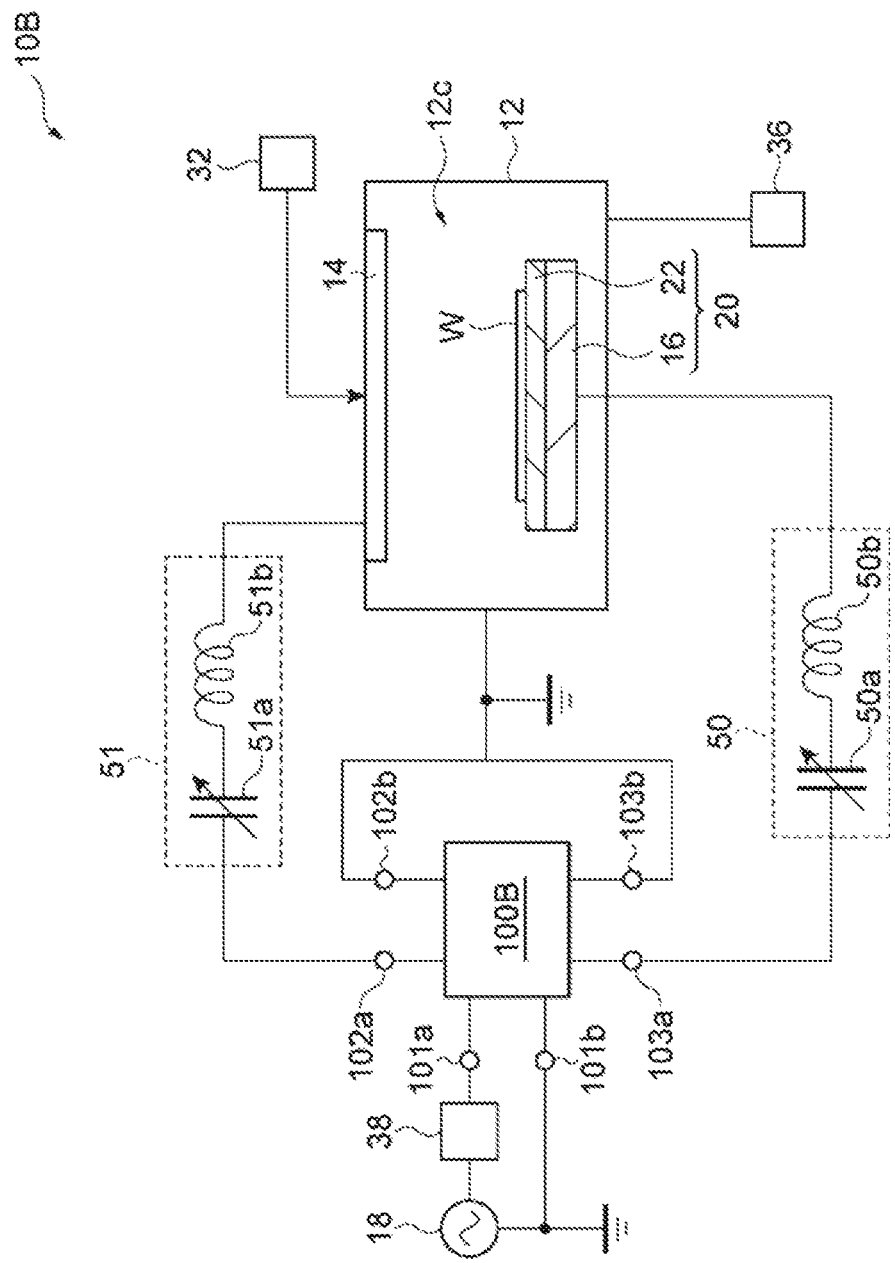
FIG. 11 is a diagram illustrating a plasma processing apparatus according to another embodiment.

Next, a plasma processing apparatus according to another embodiment will be described with reference to FIG. 11. FIG. 11 is a diagram illustrating a plasma processing apparatus according to another embodiment. Hereinafter, a difference of a plasma processing apparatus 10B illustrated in FIG. 11 from the plasma processing apparatus 10A will be described and redundant descriptions will be omitted.

The plasma processing apparatus 10B includes a transformer 100B instead of the transformer 100A. The plasma processing apparatus 10B further includes an additional impedance adjusting circuit 51. The impedance adjusting circuit 51 may include a variable condenser and/or an inductor. In the plasma processing apparatus 10B, the impedance adjusting circuit 51 is equipped with a variable condenser 51a and an inductor 51b. The variable condenser 51a and the inductor 51b are connected in series between an upper electrode 14 and a terminal 102a of the transformer 100B. Further, the impedance adjusting circuit 51 includes no element connected to the ground. A high frequency power supply 18 is coupled to a terminal 101a of the transformer 100B via a matcher 38. The impedance adjusting circuit 50 is connected between a lower electrode 16 and a terminal 103b of the transformer 100B. A terminal 102b and the terminal 103b of the transformer 100B are connected to the ground.

Figure 12:
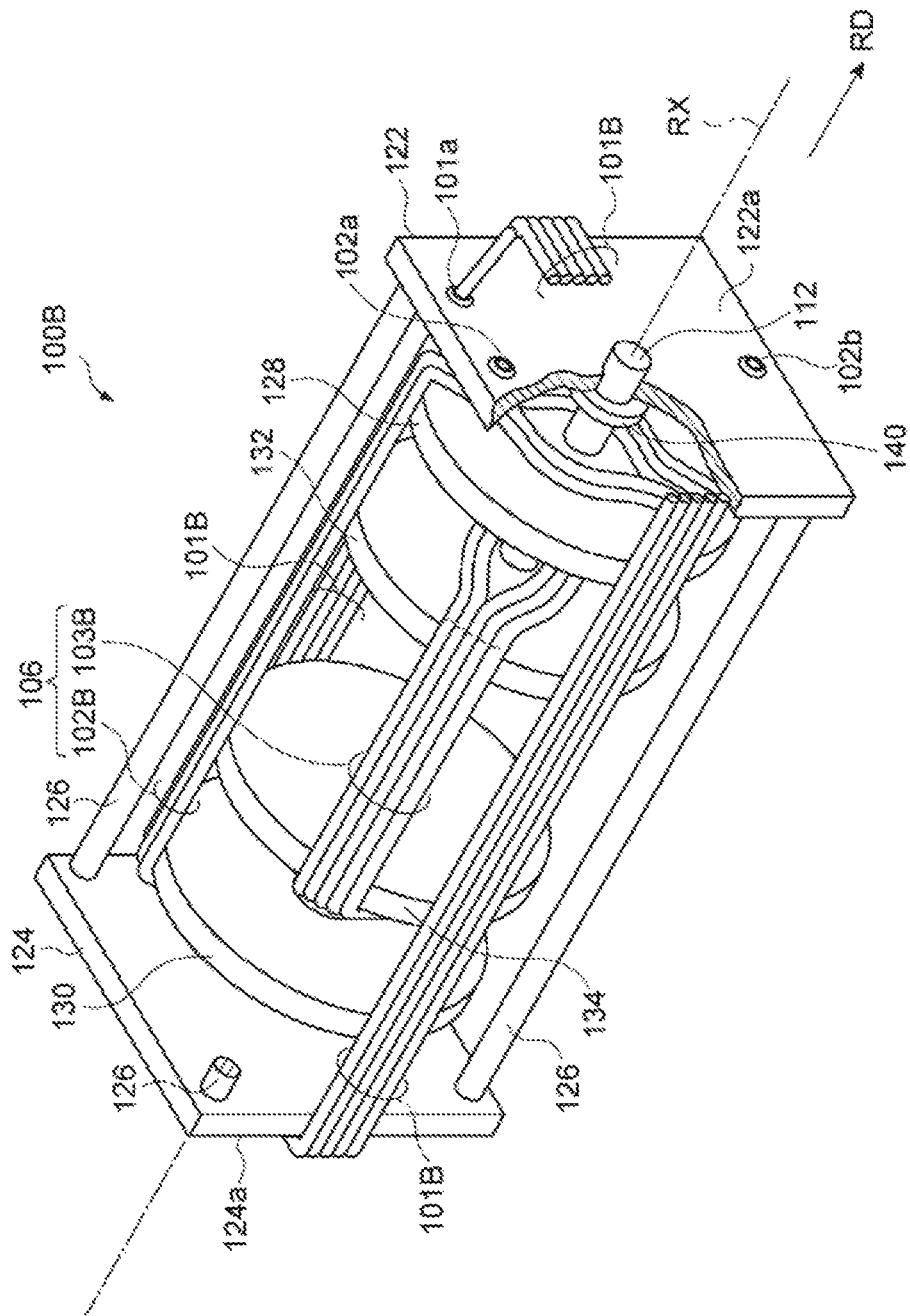
FIG. 12 is a partially broken perspective view of a transformer of the plasma processing apparatus illustrated in FIG. 11.
Figure 13:
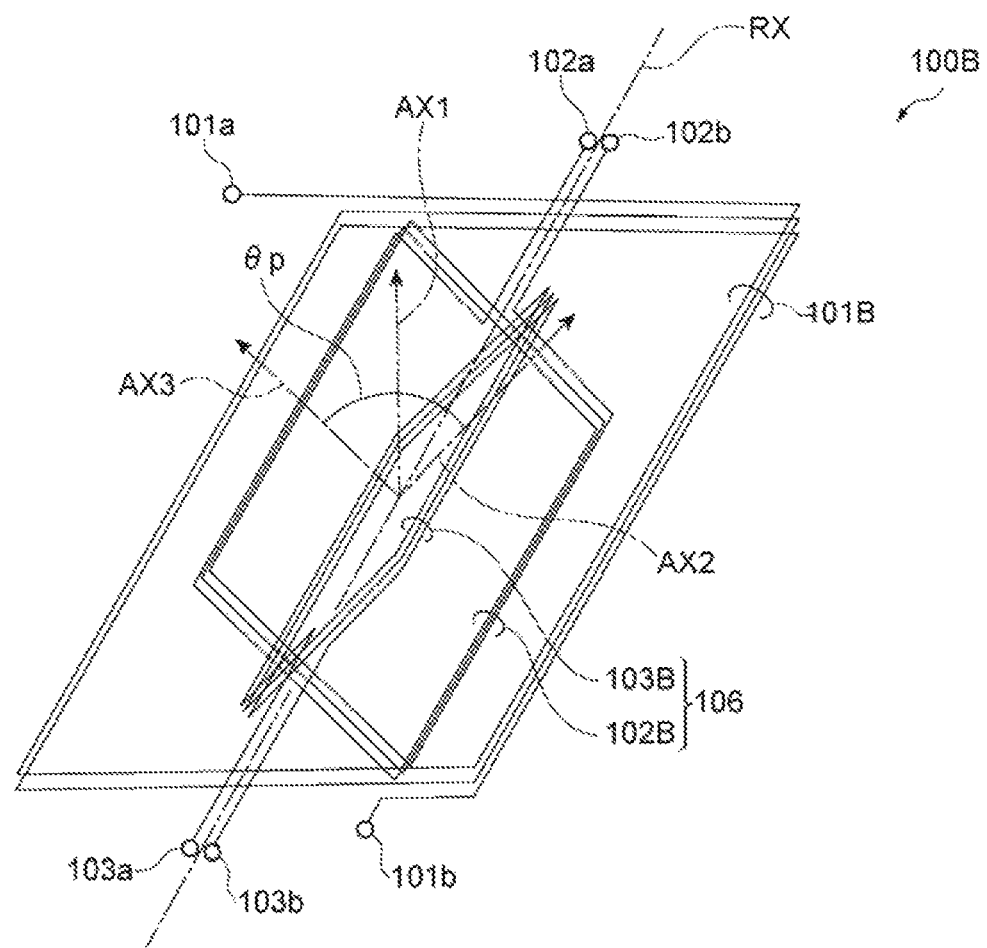
FIG. 13 is a diagram schematically illustrating three coils of the transformer illustrated in FIG. 12.

FIG. 12 is a partially broken perspective view of the transformer 100B of the plasma processing apparatus 10B illustrated in FIG. 11. FIG. 13 is a diagram schematically illustrating three coils of the transformer 100B illustrated in FIG. 12. The transformer 100B illustrated in FIGS. 12 and 13 includes a rotary shaft 112, a primary coil 101B, a first secondary coil 102B, and a second secondary coil 103B. The first secondary coil 102B and the second secondary coil 103B constitute a secondary side coil pair 106. In one embodiment, the transformer 100B further includes support members 122 and 124, posts 126, support members 128 and 130, support members 132 and 134, terminals 101a and 101b, terminals 102a and 102b, and terminals 103a and 103b.

The rotary shaft 112 has a substantially cylindrical shape. The rotary shaft 112 is installed to be rotatable around its central axis line RX, that is to say, using the central axis line RX as a rotation axis line. In one embodiment, the rotary shaft 112 is rotatably supported by the support member 122 and the support member 124. The support member 122 and the support member 124 are plate-like members and have a substantially rectangular planar shape. The support member 122 and the support member 124 are formed as insulators. The support member 122 and the support member 124 are installed to intersect with the central axis line RX or to be substantially perpendicular to the central axis line RX, and are arranged along a direction RD in which the central axis line RX extends such that their plate thickness directions are substantially identical to the direction RD. One end of the post 126 is fixed to a corner portion of the support member 122, and the other end of the post 126 is fixed to a corner portion of the support member 124. One end portion of the rotary shaft 112, which penetrates the support member 122, protrudes from the support member 122. One end portion of the rotary shaft 112 is connected to a driving mechanism (e.g., a motor).

The support member 128 and the support member 130 have a substantially disc shape and are formed as insulators.

The support member 128 and the support member 130 are installed to intersect with the central axis line RX or to be substantially perpendicular to the central axis line RX between the support member 122 and the support member 124, and are arranged along the direction RD such that their plate thickness directions are substantially identical to the direction RD. Further, the support member 132 and the support member 134 have a substantially disc shape and are formed as insulators. The support member 132 and the support member 134 are installed to intersect with the central axis line RX or to be substantially perpendicular to the central axis line RX between the support member 128 and the support member 130, and are arranged along the direction RD such that their plate thickness directions are substantially identical to the direction RD. The rotary shaft 112 penetrates the center of each of the support members 128, 130, 132, and 134. The support members 128, 130, 132, and 134 are fixed to the rotary shaft 112.

The primary coil 101B extends around a first axis line AX1 perpendicular to the central axis line RX. In one embodiment, the first axis line AX1 is perpendicular to the central axis line RX at the middle position between the support member 122 and the support member 124. The primary coil 101B is wound around the center of the first axis line AX1 to alternately pass outside the support member 122 and outside the support member 124.

One end of the primary coil 101B is connected to the terminal 101a. In one embodiment, the terminal 101a is installed in one surface 122a of the support member 122 (a surface facing the outer side of the transformer 100B). Further, the other end of the primary coil 101B is connected to the terminal 101b. In one embodiment, the terminal 101b is installed in one surface 124a of the support member 124 (a surface facing the outer side of the transformer 100B).

The first secondary coil 102B extends around a second axis line AX2. The second axis line AX2 is perpendicular to the central axis line RX within a region surrounded by the primary coil 101B. In one embodiment, the second axis line AX2 is perpendicular to the central axis line RX at the middle position between the support member 128 and the support member 130. The first secondary coil 102B is wound around the center of the second axis line AX2 to alternately pass outside the support member 128 and outside the support member 130. The first secondary coil 102B is supported by the rotary shaft 112 with the support member 128 and the support member 130 interposed therebetween.

One end of the first secondary coil 102B is connected to the terminal 102a. Further, the other end of the first secondary coil 102B is connected to the terminal 102b. In one embodiment, the terminal 102a and the terminal 102b are installed in the one surface 122a of the support member 122. The rotary shaft 112 includes a first conductor and a second conductor which are coaxially installed. One end of the first secondary coil 102B is connected to the first conductor and the other end of the first secondary coil 102B is connected to the second conductor. The first conductor is coupled to the terminal 102a via a slip ring within a rotary connector 140. Further, the second conductor is coupled to the terminal 102b via another slip ring within the rotary connector 140.

The second secondary coil 103B extends around a third axis line AX3. The third axis line AX3 is perpendicular to the central axis line RX within the region surrounded by the primary coil 101B. Further, the third axis line AX3 intersects with the second axis line AX2. The third axis line AX3 and the second axis line AX2 are disposed so as to make a predetermined angle θp with each other. Although not particularly limited, the angle θp may be, for example, 90 degrees. In one embodiment, the third axis line AX3 is perpendicular to the central axis line RX at the middle position between the support member 132 and the support member 134. The second secondary coil 103B is wound around the center of the third axis line AX3 to alternately pass outside the support member 132 and outside the support member 134. The second secondary coil 103B is supported by the rotary shaft 112 with the support member 132 and the support member 134 interposed therebetween. An insulation distance is secured between the second secondary coil 103B and the first secondary coil 102B.

One end of the second secondary coil 103B is connected to the terminal 103a. Further, the other end of the second secondary coil 103B is connected to the terminal 103b. In one embodiment, the terminal 103a and the terminal 103b are installed in the one surface 124a of the support member 124. The rotary shaft 112 includes a third conductor and a fourth conductor which are coaxially installed. One end of the second secondary coil 103B is connected to the third conductor and the other end of the second secondary coil 103B is connected to the fourth conductor. The third conductor is coupled to the terminal 103a via a slip ring within a separate rotary connector installed near the support member 124. Further, the fourth conductor is coupled to the terminal 103b via another slip ring within the separate rotary connector 140.

In the transformer 100B, when the high frequency is supplied from the high frequency power supply 18 to the primary coil 101B, the magnetic flux is generated from the primary coil 101B in a direction substantially parallel to a direction in which the first axis line AX1 extends. Further, an amount of the magnetic flux penetrating the first secondary coil 102B and an amount of the magnetic flux penetrating the second secondary coil 103B are changed by adjusting a rotation angle of the secondary side coil pair 106. In the first secondary coil 102B, an induced electromotive force is generated depending on an amount of the magnetic flux penetrating through the first secondary coil 102B. Further, in the second secondary coil 103B, an induced electromotive force is generated depending on an amount of the magnetic flux penetrating through the second secondary coil 103B. Thus, according to the transformer 100B, it is possible to adjust a ratio of the electric power of the high frequency distributed to the first secondary coil 102B and the electric power of the high frequency distributed to the second secondary coil 103B. According to the plasma processing apparatus 10B having the transformer 100B configured as above, similar to the plasma processing apparatus 10A, the adjustable range of the energy of the ions incident to the workpiece W disposed on the lower electrode 16 is enlarged.

Figure 14:
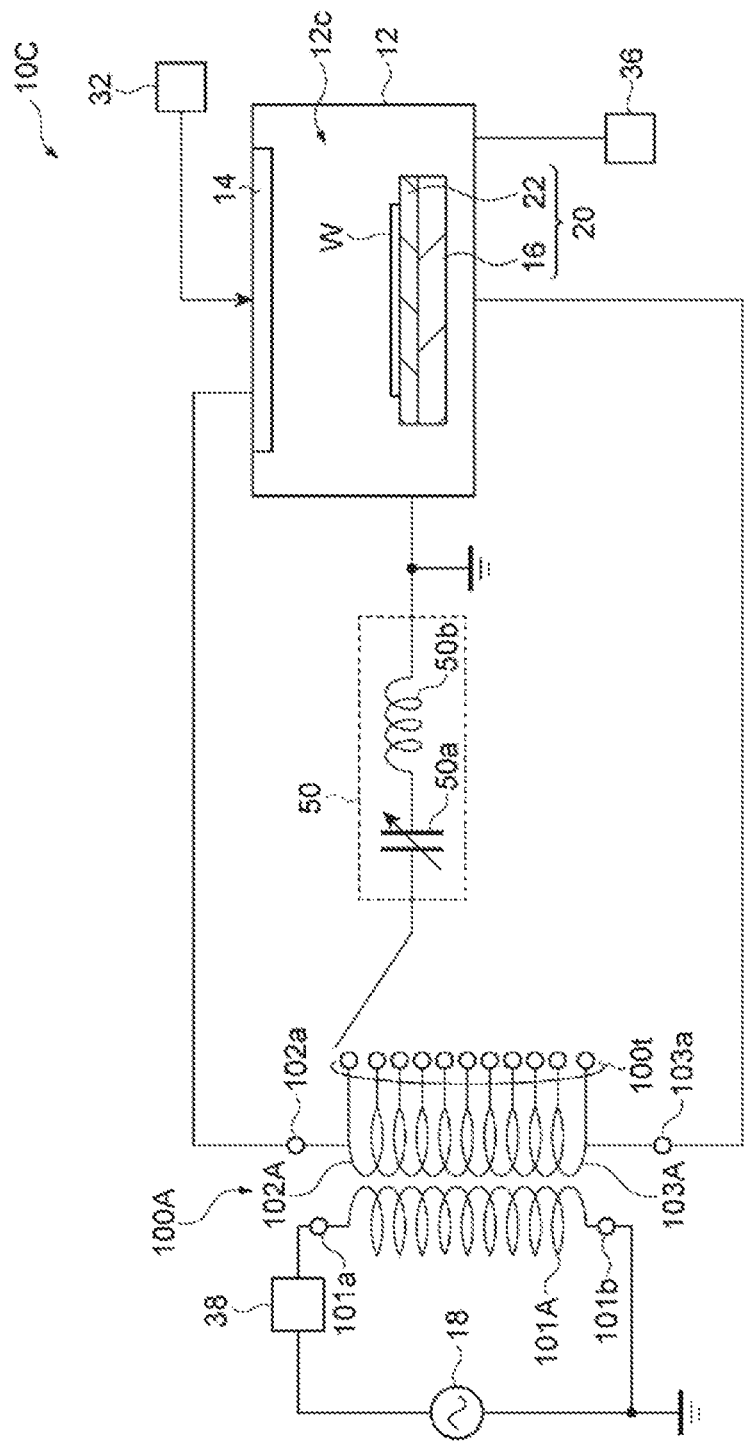
FIG. 14 is a diagram illustrating a plasma processing apparatus according to yet another embodiment.

Next, a plasma processing apparatus according to yet another embodiment will be described with reference to FIG. 14. FIG. 14 is a diagram illustrating a plasma processing apparatus according to yet another embodiment. Hereinafter, a difference of a plasma processing apparatus 10C illustrated in FIG. 14 from the plasma processing apparatus 10A will be described and redundant descriptions will be omitted.

In the plasma processing apparatus 10C, the impedance adjusting circuit 50 is installed between the plurality of taps 100t and the ground. In this manner, the impedance adjusting circuit 50 may be installed in a serial circuit between the lower electrode 16 and the ground to which the secondary side coil of the transformer 100A is connected.

Figure 15:
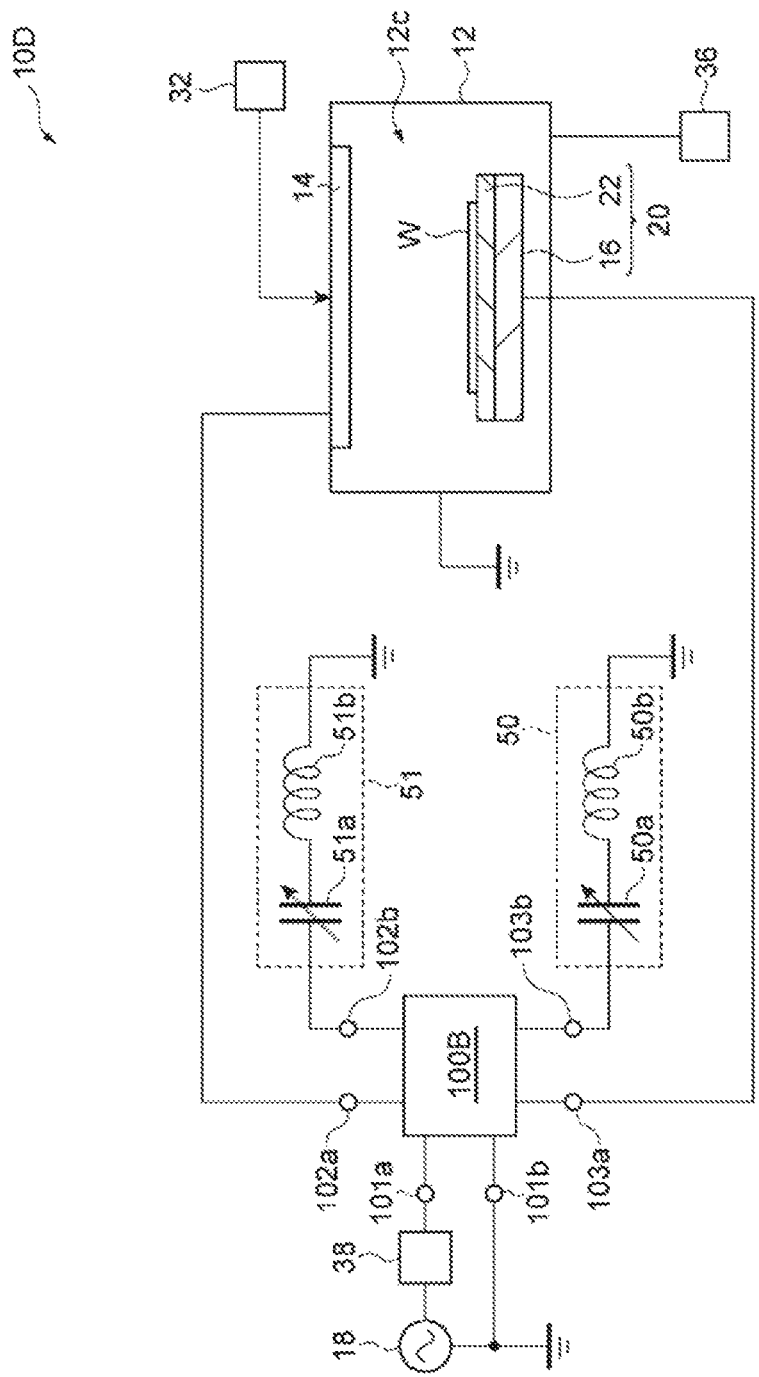
FIG. 15 is a diagram illustrating a plasma processing apparatus according to yet another embodiment.

Next, a plasma processing apparatus according to yet another embodiment will be described with reference to FIG. 15. FIG. 15 is a diagram illustrating a plasma processing apparatus according to yet another embodiment. Hereinafter, a difference of a plasma processing apparatus 10D illustrated in FIG. 15 from the plasma processing apparatus 10A will be described and redundant descriptions will be omitted.

In the plasma processing apparatus 10D, the impedance adjusting circuit 50 is installed between the terminal 103b and the ground. In addition, the impedance adjusting circuit 51 is installed between the terminal 102b and another ground. In this manner, when the first secondary coil 102B and the second secondary coil 103B are connected to the separate grounds, separate impedance adjusting circuits may be installed between the first secondary coil 102B and the ground, and between the second secondary coil 103B and the ground.

Figure 16:
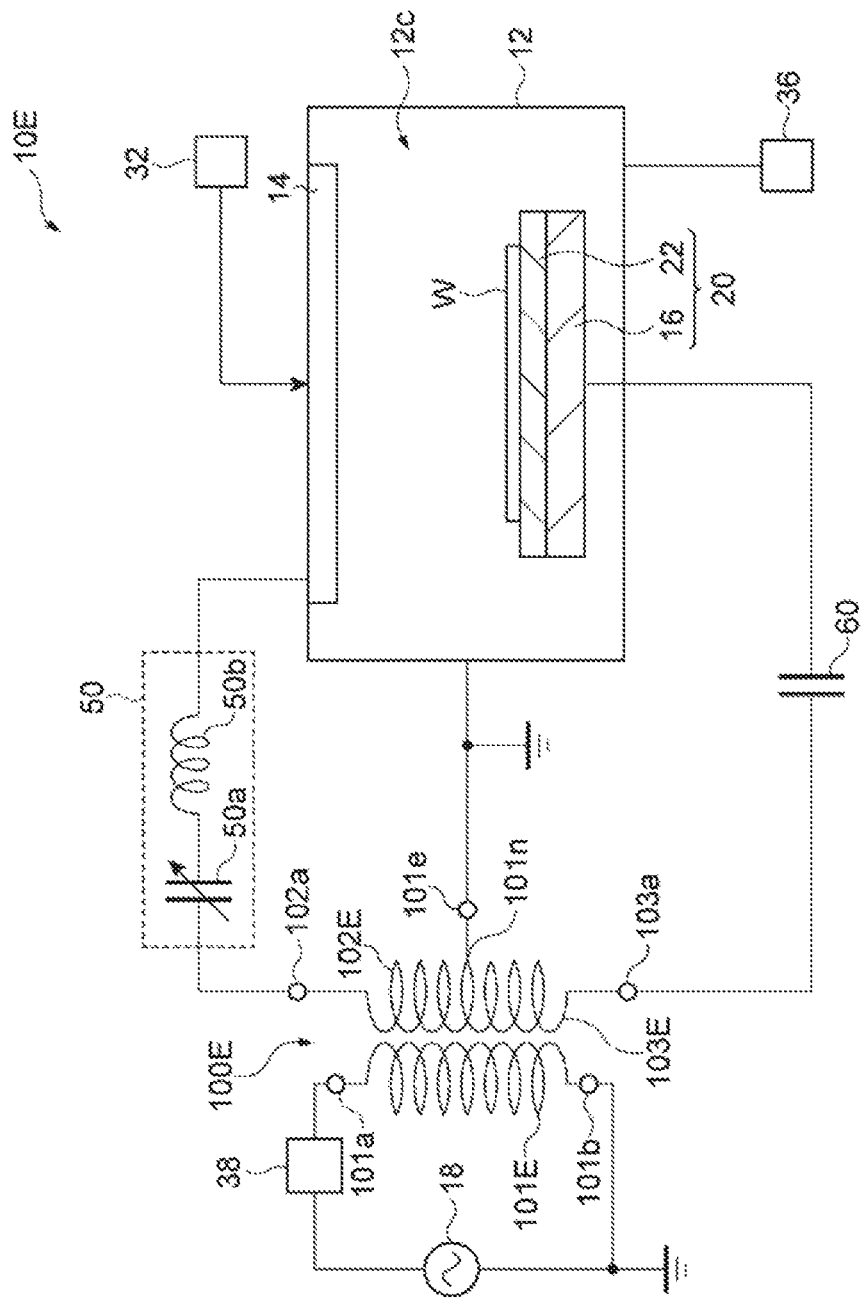
FIG. 16 is a diagram illustrating a plasma processing apparatus according to yet another embodiment.
Figure 17:
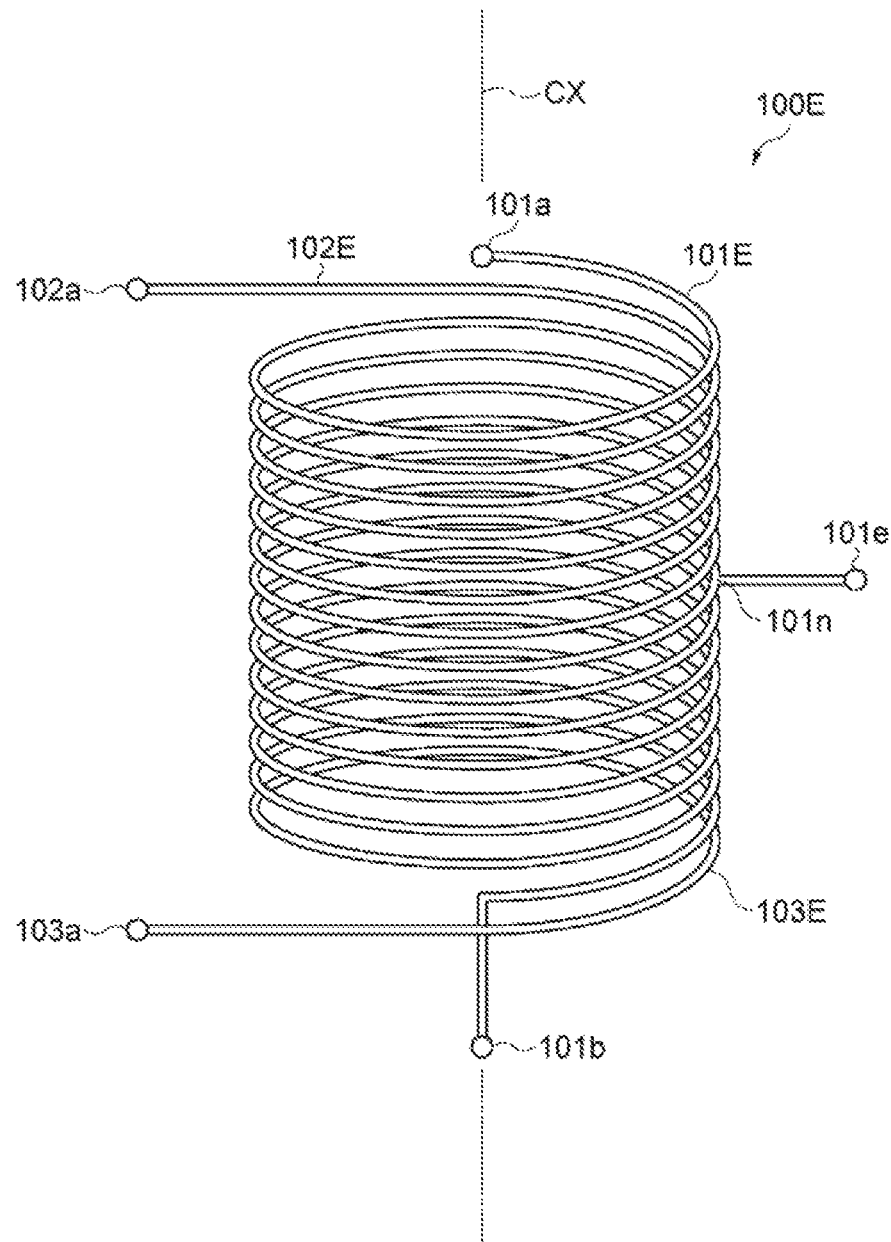
FIG. 17 is a diagram illustrating a transformer of the plasma processing apparatus illustrated in FIG. 16.

Next, a plasma processing apparatus according to yet another embodiment will be described with reference to FIGS. 16 and 17. FIG. 16 is a diagram illustrating a plasma processing apparatus according to yet another embodiment. FIG. 17 is a diagram illustrating a transformer of the plasma processing apparatus illustrated in FIG. 16. Hereinafter, a difference of a plasma processing apparatus 10E illustrated in FIG. 16 from the plasma processing apparatus 10A will be described and redundant descriptions will be omitted.

The plasma processing apparatus 10E includes a transformer 100E instead of the transformer 100A. The transformer 100E includes a primary coil 101E, a first secondary coil 102E, and a second secondary coil 103E. The primary coil 101E is similar to the primary coil 101A. One end of the primary coil 101E is the terminal 101a and is coupled to the high frequency power supply 18 via the matcher 38. The other end of the primary coil 101E is the terminal 101b, and is connected to the high frequency power supply 18 and grounded.

Similar to the first secondary coil 102A and the second secondary coil 103A, the first secondary coil 102E and the second secondary coil 103E are formed as a single coil. A middle node 101n of this single coil is connected to a terminal 101e. The terminal 101e is connected to the ground. With respect to the node 101n, one side portion of the single coil is the first secondary coil 102E, and the other side portion of the single coil is the second secondary coil 103E. One end of the first secondary coil 102E is the terminal 102a and is coupled to the upper electrode 14 via the impedance adjusting circuit 50. Further, one end of the second secondary coil 103E is a terminal 103a and is coupled to the lower electrode 16 via a condenser 60. In this transformer 100E, grounded places of a winding of the single coil are fixed. Thus, a ratio of the number of turns of the first secondary coil 102E and the number of turns of the second secondary coil 103E is uniform.

Here, when the high frequency power supply is connected to the primary coil and a load of the complex impedance $Z_2$ is connected to the secondary coil, a ratio of a current value of the primary coil and a current value of the secondary coil is expressed by Eq. (3) below. In Eq. (3), $L_1$ denotes a self-inductance of the primary coil, $L_2$ denotes a self-inductance of the secondary coil, k is a coupling factor between the primary coil and the secondary coil, and $\omega$ denotes an angular frequency of the high frequency. Further, the complex impedance $Z_2$ is the impedance of the plasma and the impedance of a power supply circuit between the secondary coil and the plasma.

$$\frac{I_2}{I_1} = \frac{ik\sqrt{L_1 L_2}\,\omega}{Z_2 + iL_2\omega} \quad (3)$$

When the complex impedance $Z_2$ is adjusted such that a denominator of Eq. (3) is reduced, i.e., such that serial resonance is generated in the secondary side, a value of current flowing to the secondary side is increased. Meanwhile, when the complex impedance $Z_2$ is adjusted such that the denominator of Eq. (3) is increased, the value of current flowing to the secondary side is reduced. In the transformer 100E, when a current flowing through one of the two secondary coils increases and the electric power of the high frequency distributed to the respective secondary coil increases, the electric power of the high frequency distributed to the other secondary coil is reduced. Thus, although the grounded places of the single coil constituting the two secondary coils are fixed, it is possible to adjust the electric power of the high frequency supplied to the upper electrode 14 and the electric power of the high frequency supplied to the lower electrode 16 by the impedance adjustment performed by the impedance adjusting circuit 50. Thus, according to the plasma processing apparatus 10E, it is possible to adjust the energy of the ions incident to the lower electrode 16.

Hereinafter, the results of experiment conducted to evaluate the plasma processing apparatus 10E will be described. The primary coil 101E of the transformer 100E used in this experiment was a coil whose diameter is 42 mm and the number of turns is 27. Further, the single coil constituting the first secondary coil 102E and the second secondary coil 103E was also a coil whose diameter is 42 mm and the number of turns is 27. In the single coil, a 13th turn thereof was connected to the ground. And then, an argon (Ar) gas of 600 sccm was supplied to the chamber 12c, an internal pressure of the chamber 12c was set at 800 mTorr (106.7 Pa), and the high frequency and the electric power of the high frequency power supply 18 were respectively set at 13.56 MHz and 200 W. In addition, a current of each of the chamber body 12, the upper electrode 14 and the lower electrode 16, a high frequency voltage of each of the upper electrode 14 and the lower electrode 16, and a DC electric potential of each of the upper electrode 14 and the lower electrode 16 were measured, while setting the impedance of the impedance adjusting circuit 50 at various impedances by changing a dial value of the variable condenser 50a of the impedance adjusting circuit 50.

Figure 18A:
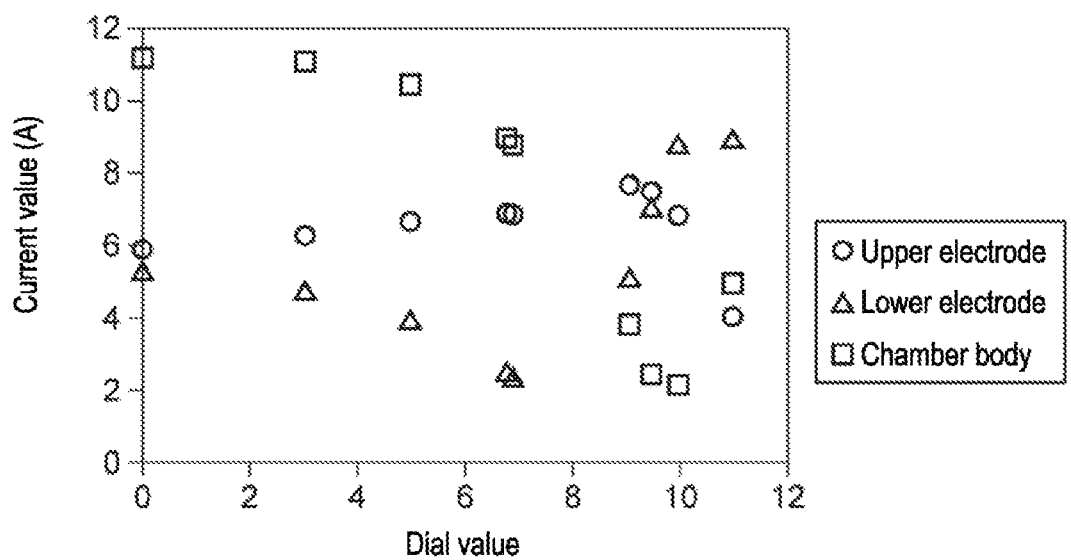
FIG. 18A is a graph illustrating a relationship between a dial value of a variable condenser and a current of each of a chamber body, an upper electrode and a lower electrode, obtained by using a plasma processing apparatus.
Figure 18B:
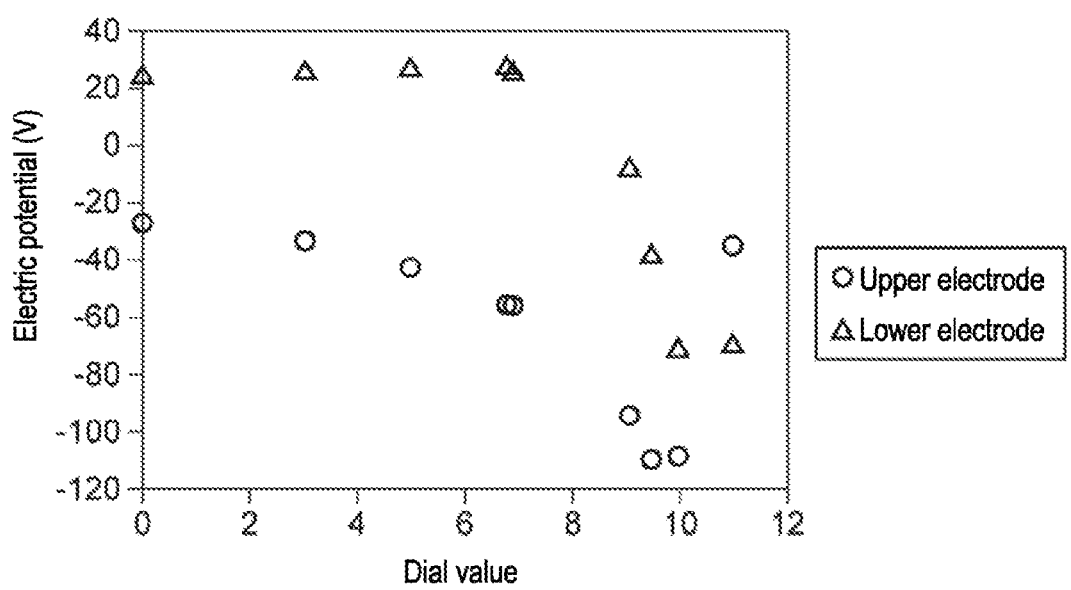
FIG. 18B is a graph illustrating a relationship between the dial value of the variable condenser and a DC electric potential of each of the upper electrode and the lower electrode, obtained by using the plasma processing apparatus.

FIG. 18A illustrates a relationship between a dial value of the variable condenser 50a and a current of each of the chamber body 12, the upper electrode 14 and the lower electrode 16, and FIG. 18B illustrates a relationship between a dial value of the variable condenser 50a and a DC electric potential of each of the upper electrode 14 and the lower electrode 16.

In the impedance adjusting circuit 50 used in the experiment, when the dial value of the variable condenser 50a is close to 8, the impedance of the first secondary coil 102E, the impedance of the impedance adjusting circuit 50, and the impedance of a plasma load of the upper electrode 14 were brought into a serial resonance state. That is to say, the denominator illustrated in Eq. (3) was turned to zero. In this serial resonance state, a current flowed through only the upper electrode 14 and no current flowed through the lower electrode 16. In a state in which the dial value of the variable condenser 50a is smaller than 8, the denominator of Eq. (3) is positive and in a state in which the dial value of the variable condenser 50a is greater than 8, the denominator of Eq. (3) is negative. Thus, when the current flowing from the upper electrode 14 to the lower electrode 16 is in an in-phase direction, an anti-phase current flowed in a state in which the dial value of the variable condenser 50a is smaller than 8 and an in-phase current flowed in a state in which the dial value of the variable condenser 50a is greater than 8. In this manner, it is possible to adjust a ratio of the electric power supplied to the upper electrode 14 and the lower electrode 16 by the impedance adjusting circuit 50.

As illustrated in FIG. 18A, according to the result of setting the dial value of the variable condenser 50a to become greater than 8, the current value of the upper electrode 14 was reduced and the current value of the lower electrode 16 was increased. Further, when the dial value of the variable condenser 50a is a certain value greater than 8, the current value of the upper electrode 14 and the current value of the lower electrode 16 were substantially equal to each other and the current flowing in the chamber body 12 was minimized. Thus, when the dial value of the variable condenser 50a is set at such value, plasma is confined between the upper electrode 14 and the lower electrode 16. Accordingly, it was confirmed that it is possible to stably generate plasma by adjusting the dial value of the variable condenser 50a.

Further, as illustrated in FIG. 18B, a DC electric potential of the lower electrode 16 was significantly changed from a negative electric potential to a positive electric potential depending on the dial value of the variable condenser 50a. Thus, in the plasma processing apparatus 10E, it was confirmed that the adjustable range of the energy of the ions incident to the workpiece disposed on the lower electrode 16 is enlarged.

While various embodiments have been described above, the present disclosure is not limited to the aforementioned embodiments but may be differently modified. For example, a place in which the impedance adjusting circuit is disposed is not limited to the places in which the impedance adjusting circuit is disposed in the aforementioned embodiments. The impedance adjusting circuit may be installed at a proper place in one or both of the serial circuit between the upper electrode 14 and the ground connected to the other end of the first secondary coil, and the serial circuit between the lower electrode 16 and the ground connected to the other end of the second secondary coil.

According to the present disclosure in some embodiments, it is possible to provide a plasma processing apparatus in which an adjustable range of the energy of the ions incident to a workpiece disposed on an electrode is enlarged.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A capacitively coupled plasma processing apparatus, comprising:
    a chamber body configured to provide a chamber;
    a first electrode and a second electrode installed such that an internal space of the chamber is defined between the first electrode and the second electrode;

a high frequency power supply;

a matcher for impedance matching connected to the high frequency power supply;

a transformer including a primary coil coupled to the high frequency power supply via the matcher, a first secondary coil and a second secondary coil, wherein one end of the first secondary coil is connected to the first electrode and one end of the second secondary coil is connected to the second electrode; and at least one impedance adjusting circuit having a variable condenser installed in at least one of a first serial circuit and a second serial circuit, the first serial circuit being defined by a serial circuit between the first electrode and a ground connected to the other end of the first secondary coil, the second serial circuit being defined by a serial circuit between the second electrode and a ground connected to the other end of the second secondary coil, wherein the transformer further includes a rotary shaft configured to rotate using a central axis line of the rotary shaft as a rotation axis line, the primary coil extends around a first axis line perpendicular to the central axis line, the first secondary coil extends around a second axis line and is supported by the rotary shaft, and the second axis line is perpendicular to the central axis line within a region surrounded by the primary coil, and the second secondary coil extends around a third axis line and is supported by the rotary shaft, and the third axis line is perpendicular to the central axis line within the region and defines a predetermined angle with respect to the second axis line.

2. The apparatus of claim 1, wherein the at least one impedance adjusting circuit includes an inductor installed in the at least one of the first serial circuit and the second serial circuit.

* * * * *